US011934606B2

(12) United States Patent
Xiong et al.

(10) Patent No.: US 11,934,606 B2
(45) Date of Patent: Mar. 19, 2024

(54) FLEXIBLE CIRCUIT BOARD AND MANUFACTURING METHOD, DISPLAY DEVICE, CIRCUIT BOARD STRUCTURE AND DISPLAY PANEL THEREOF

(71) Applicants: Chengdu BOE Optoelectronics Technology Co., Ltd., Sichuan (CN); BOE Technology Group Co., Ltd., Beijing (CN)

(72) Inventors: Ren Xiong, Beijing (CN); Qiang Tang, Beijing (CN); Huiqiang Song, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/945,064

(22) Filed: Sep. 14, 2022

(65) Prior Publication Data
US 2023/0021173 A1    Jan. 19, 2023

Related U.S. Application Data

(63) Continuation of application No. 17/418,771, filed as application No. PCT/CN2020/082216 on Mar. 30, 2020, now Pat. No. 11,500,489.

(30) Foreign Application Priority Data

Jan. 30, 2019 (CN) .......................... 201910093341.0
Nov. 19, 2019 (CN) .......................... 201911136276.1
Jan. 22, 2020 (CN) .......................... 202010075431.X

(51) Int. Cl.
G06F 3/041    (2006.01)
G06F 3/044    (2006.01)
H05K 1/18    (2006.01)

(52) U.S. Cl.
CPC ........ *G06F 3/04164* (2019.05); *G06F 3/0412* (2013.01); *G06F 3/044* (2013.01);
(Continued)

(58) Field of Classification Search
CPC ............... G06F 3/04164; G06F 3/0412; G06F 2203/04111
See application file for complete search history.

(56) References Cited

U.S. PATENT DOCUMENTS 6,801,440 B2    10/2004    Inoue et al.
8,383,948 B2    2/2013    Aoyama et al.
(Continued)

FOREIGN PATENT DOCUMENTS

CN    102026480 A    4/2011
CN    103135837 A    6/2013
(Continued)

OTHER PUBLICATIONS

Extended European Search Report issued in Application No. 20748627.5 dated Oct. 7, 2022,(9p).
(Continued)

*Primary Examiner* — Van N Chow
(74) *Attorney, Agent, or Firm* — Arch & Lake LLP

(57) ABSTRACT

This disclosure provides a flexible circuit board and a manufacturing method therefor, and a display device. The flexible circuit board includes a main body sub-circuit board and a bridge sub-circuit board. The main body sub-circuit board includes a first substrate, as well as a first bridge connection end, a second bridge connection end, a first wiring portion, and a second wiring portion disposed on the first substrate. The bridge sub-circuit board includes a second substrate, as well as a third bridge connection end, a
(Continued)

fourth bridge connection end, and a third wiring portion used for a first functional wiring, all disposed on the second substrate.

18 Claims, 23 Drawing Sheets

(52) U.S. Cl.
CPC ... *H05K 1/189* (2013.01); *G06F 2203/04102* (2013.01); *G06F 2203/04107* (2013.01); *G06F 2203/04111* (2013.01); *H05K 2201/10128* (2013.01)

(56) References Cited

U.S. PATENT DOCUMENTS

| | | | |
|---|---|---|---|
| 8,711,570 | B2 | 4/2014 | Hotelling et al. |
| 9,201,461 | B2 | 12/2015 | Hotelling et al. |
| 9,431,333 | B2 | 8/2016 | Rokugawa |
| 9,596,769 | B2 | 3/2017 | Ku et al. |
| 9,600,113 | B2 | 3/2017 | Hotelling et al. |
| 9,930,778 | B2 | 3/2018 | Ito et al. |
| 9,992,862 | B2 | 6/2018 | Shin et al. |
| 10,070,512 | B2 | 9/2018 | Ku et al. |
| 10,321,559 | B2 | 6/2019 | Meng et al. |
| 2001/0052423 | A1 | 12/2001 | Achari et al. |
| 2002/0131258 | A1 | 9/2002 | Inoue et al. |
| 2004/0162120 | A1 | 8/2004 | Kurono |
| 2006/0129061 | A1 | 6/2006 | Kaneto et al. |
| 2006/0227279 | A1 | 10/2006 | Ting |
| 2008/0102656 | A1 | 5/2008 | Lin et al. |
| 2010/0204583 | A1 | 8/2010 | Rhim et al. |
| 2011/0067904 | A1* | 3/2011 | Aoyama ............ H05K 3/4069 174/254 |
| 2012/0326990 | A1 | 12/2012 | Wurzel et al. |
| 2013/0141912 | A1 | 6/2013 | Kim |
| 2013/0335931 | A1 | 12/2013 | Snider et al. |
| 2014/0192276 | A1 | 7/2014 | Hotelling et al. |
| 2016/0005685 | A1 | 1/2016 | Rokugawa |
| 2016/0077647 | A1 | 3/2016 | Hotelling et al. |
| 2016/0128176 | A1 | 5/2016 | Ku et al. |
| 2016/0198560 | A1 | 7/2016 | Shin et al. |
| 2016/0270224 | A1* | 9/2016 | Ito ........................ H05K 1/117 |
| 2016/0286649 | A1 | 9/2016 | Choi |
| 2017/0150592 | A1 | 5/2017 | Ku et al. |
| 2017/0196080 | A1 | 7/2017 | Meng et al. |
| 2019/0079620 | A1* | 3/2019 | Yoshida ............... G02F 1/1368 |
| 2019/0088350 | A1 | 3/2019 | Matsumoto |
| 2019/0250447 | A1 | 8/2019 | Abe et al. |

FOREIGN PATENT DOCUMENTS

| | | |
|---|---|---|
| CN | 103517551 A | 1/2014 |
| CN | 103765355 A | 4/2014 |
| CN | 105246247 A | 1/2016 |
| CN | 105263262 A | 1/2016 |
| CN | 105632382 A | 6/2016 |
| CN | 105744719 A | 7/2016 |
| CN | 105792516 A | 7/2016 |
| CN | 105960091 A | 9/2016 |
| CN | 205829726 U | 12/2016 |
| CN | 106465541 A | 2/2017 |
| CN | 206181557 U | 5/2017 |
| CN | 107393422 A | 11/2017 |
| CN | 108012408 A | 5/2018 |
| CN | 108012458 A | 5/2018 |
| CN | 207410590 U | 5/2018 |
| CN | 108112157 A | 6/2018 |
| CN | 207458015 U | 6/2018 |
| CN | 108770182 A | 11/2018 |
| CN | 109067015 A | 12/2018 |
| CN | 109121285 A | 1/2019 |
| CN | 109213387 A | 1/2019 |
| CN | 208621794 U | 3/2019 |
| CN | 109597508 A | 4/2019 |
| CN | 109600939 A | 4/2019 |
| CN | 107393422 B | 9/2019 |
| CN | 11048384 A | 11/2019 |
| CN | 110413156 A | 11/2019 |
| CN | 110493949 A | 11/2019 |
| CN | 110831328 A | 2/2020 |
| EP | 2538301 A1 | 12/2012 |
| EP | 26575254 A1 | 12/2013 |
| EP | 2931009 A1 | 10/2015 |
| GB | 2376347 A | 12/2002 |
| GB | 2376347 B | 4/2003 |
| JP | H09318965 A | 12/1997 |
| JP | H10321978 A | 12/1998 |
| JP | 2001077501 A | 3/2001 |
| JP | 2001119120 A | 4/2001 |
| JP | 2003188486 A | 7/2003 |
| JP | 2012208732 A | 10/2012 |
| JP | 2013098296 A | 5/2013 |
| JP | 2014123640 A | 7/2014 |
| TW | 479443 B | 3/2002 |
| WO | 2012177351 A1 | 12/2012 |
| WO | 2016088461 A1 | 6/2016 |
| WO | 2017111993 A1 | 6/2017 |
| WO | 2019041472 A1 | 3/2019 |

OTHER PUBLICATIONS

Notice of Allowance issued in U.S. Appl. No. 17/864,731 dated Nov. 9, 2022, (23p).
Non-Final Office Action to U.S. Appl. No. 17/418,771 dated Mar. 16, 2022, (37p).
International Search Report and Written Opinion of International Application No. PCT/CN2020/082216, dated Jul. 7, 2020, (10p).
First Office Action to Chinese Application No. 201911136276.1 dated Jul. 23, 2020, (17p).
Second Office Action to Chinese Application No. 20191136276.1 dated Nov. 20, 2020, (15p).
Decision of Rejection issued to Chinese Application No. 20191136276.1 dated Mar. 3, 2021, (13p).
Notification of Reexamination issued to Chinese Application No. 20191136276.1 dated Nov. 29, 2021,(16p).
First Office Action issued to Chinese Application No. 202010075431 X dated Mar. 12, 2021, (22p).
Notice of Allowance issued in Chinese Application No. 202010075431.X dated Aug. 23, 2021, (10p).
International Search Report and Written Opinion of International Application No. PCT/CN2020/073940 dated Apr. 10, 2020 with English Translation, (7p).
First Office Action to Indian Application No. 202017047298 dated Dec. 6, 2021 with English translation, (5p).
First Office Action to Indian Application No. 202127051323 dated Jun. 28, 2022 with English translation, (5p).
Non-Final Office Action to U.S. Appl. No. 17/418,771 dated Mar. 16, 2022, (xp).
Notice of Allowability issued in U.S. Appl. No. 17/418,771 dated Aug. 3, 2022, (5p).
Notice of Allowance issued in U.S. Appl. No. 16/958,937 dated Jul. 8, 2022, (30p).
Notice of Allowance issued to U.S. Appl. No. 18/094,683 dated Jun. 7, 2023 (19p).
OA for JP application 2020-561738 dated Oct. 10, 2023 with English translation, 10 pages.

* cited by examiner

FLEXIBLE CIRCUIT BOARD AND MANUFACTURING METHOD, DISPLAY DEVICE, CIRCUIT BOARD STRUCTURE AND DISPLAY PANEL THEREOF

CROSS-REFERENCE TO RELATED APPLICATIONS

This application is a continuation of U.S. application Ser. No. 17/418,771, which is based upon and claims the priority of PCT patent application No. PCT/CN2020/082216 filed on Mar. 30, 2020 which claims priorities of Chinese application No. 201910093341.0, filed on Jan. 30, 2019 and entitled "FLEXIBLE CIRCUIT BOARD AND MANUFACTURING METHOD, DISPLAY DEVICE", Chinese application No. 202010075431.X, filed on Jan. 22, 2020 and entitled "FLEXIBLE CIRCUIT BOARD AND MANUFACTURING METHOD, DISPLAY DEVICE", and Chinese application No. 201911136276.1, filed on Nov. 19, 2019 and entitled "CIRCUIT BOARD STRUCTURE, AND DISPLAY DEVICE THEREOF", the entire contents of which are incorporated herein by reference.

TECHNICAL FIELD

Embodiments of the present disclosure relate to a flexible circuit board and a manufacturing method thereof, a display device, a circuit board structure and a display panel thereof.

BACKGROUND

The flexible printed circuit (FPC) is a highly reliable and flexible circuit board made of flexible thin film as a base material. The flexible circuit board has high wiring density, good flexibility, and it is light, thin, and widely used in various electronic devices such as mobile phones, computers and displays.

The FPC in the OLED display panel generally includes display-related circuits and touch-related circuits. It is necessary to minimize occupied space of FPC for limitation of the size of display panel.

In related art, the FPC generally adopts a design of six-layer soft and hard combination. The display-related circuits and the touch-related circuits may be arranged in different laminated structures, so as to reduce the occupied space of FPC.

However, the structure design of a six-layer FPC is difficult, the manufacturing process thereof is complicated and the cost is high. Because of few corresponding manufacturers in China with not high technical capabilities, manufacturers abroad at present are primary suppliers of the six-layer boards, but have long delivery period, so that it is not convenient for the flexible operation of an project.

It should be noted that the information disclosed in the above "Background" section is merely intended to reinforce understanding of the background technology of the present disclosure, accordingly the Background may include information that does not constitute the prior art as already known by an ordinary person skilled in the art.

SUMMARY

The present disclosure provides a flexible circuit board and a manufacturing method thereof, a display device, a circuit board structure and a display panel thereof, to solve the technical problems of difficult design, complex manufacturing process and high cost of a six-layer board in related art.

Other features and advantages of the present disclosure will become apparent from the following detailed description, or in part, will be learned by practice of the present disclosure.

At least one embodiment of the present disclosure provides a flexible circuit board. The flexible circuit board includes a main body sub-circuit board including a first substrate, and a first bridge connection end, a second bridge connection end, a first wiring portion and a second wiring portion on the first substrate, in which the first wiring portion and the second wiring portion are separated from each other and electrically connected to the first bridge connection end and the second bridge connection end, respectively; a bridge sub-circuit board including a second substrate, and a third bridge connection end, a fourth bridge connection end and a third wiring portion for a first functional wiring on the second substrate, in which the third bridge connection end and the fourth bridge connection end are electrically connected by the third wiring portion, the bridge sub-circuit board being configured to be installed on the main body sub-circuit board by electrically connecting the third bridge connection end and the fourth bridge connection end to the first bridge connection end and the second bridge connection end, respectively, so that the first wiring portion, the third wiring portion and the second wiring portion are sequentially electrically connected to obtain the first functional wiring; an outline shape of the first substrate being different from that of the second substrate.

For example, in the flexible circuit board provided by at least one embodiment of the present disclosure, an outline shape of the bridge sub-circuit board is a symmetrical structure.

For example, in the flexible circuit board provided by at least one embodiment of the present disclosure, an outline shape of the bridge sub-circuit board is an asymmetric structure.

For example, in the flexible circuit board provided by at least one embodiment of the present disclosure, the third bridge connection end and the fourth bridge connection end on the bridge sub-circuit board are symmetrically arranged on both sides of the bridge sub-circuit board.

For example, the flexible circuit board provided by at least one embodiment of the present disclosure further includes a first control circuit combination structure, in which the first control circuit combination structure is disposed on the main body sub-circuit board and electrically connected to the first wiring portion, or the first control circuit combination structure is disposed on the bridge sub-circuit board and electrically connected to the third wiring portion; the first control circuit combination structure being configured to provide a first electrical signal to the first functional wiring or receive a first electrical signal from the first functional wiring.

For example, in the flexible circuit board provided by at least one embodiment of the present disclosure, the main body sub-circuit board further includes a second functional wiring. The second functional wiring is electrically connected to the first control circuit combination structure on the main body sub-circuit board, the first control circuit combination structure is further configured to provide a second electrical signal to the second functional wiring or receive a second electrical signal from the second functional wiring.

For example, in the flexible circuit board provided by at least one embodiment of the present disclosure, the first functional wiring is obtained by sequentially electrically connecting the first wiring portion, the third wiring portion and the second wiring portion, and is used to transmit a touch driving signal, and the second functional wiring is used to transmit a touch sensing signal.

For example, in the flexible circuit board provided by at least one embodiment of the present disclosure, the first functional wiring is obtained by sequentially electrically connecting the first wiring portion, the third wiring portion and the second wiring portion, and is used to transmit a touch sensing signal, and the second functional wiring is used to transmit a touch driving signal.

For example, in the flexible circuit board provided by at least one embodiment of the present disclosure, the main body sub-circuit board further includes a third functional wiring. The third functional wiring is between the first wiring portion and the second wiring portion, and the bridge sub-circuit board is connected to the third functional wiring. The first wiring portion and the second wiring portion pass under the bridge sub-circuit board for connection.

For example, in the flexible circuit board provided by at least one embodiment of the present disclosure, the main body sub-circuit board further includes a third functional wiring. The third functional wiring is between the first wiring portion and the second wiring portion, and an orthographic projection of the third functional wiring on the first substrate at least partially overlaps with an orthographic projection of the bridge sub-circuit board on the first substrate.

For example, in the flexible circuit board provided by at least one embodiment of the present disclosure, the third functional wiring is configured to transmit a signal different from that of the first functional wiring and the second functional wiring.

For example, in the flexible circuit board provided by at least one embodiment of the present disclosure, the third functional wiring is used to provide a signal for a display circuit.

For example, in the flexible circuit board provided by at least one embodiment of the present disclosure, the third functional wiring extends to a side of the main body sub-circuit board and is electrically connected to a terminal at the side of the main body sub-circuit board.

For example, in the flexible circuit board provided by at least one embodiment of the present disclosure, the first wiring portion, the second wiring portion, and the third functional wiring are wired in a same direction.

For example, in the flexible circuit board provided by at least one embodiment of the present disclosure, the main body sub-circuit board includes a first main body wiring layer at a first side of the first substrate, and a first main body insulating layer laminated on a side of the first main body wiring layer far away from the first substrate, and the first side is a side of the main body sub-circuit board close to the bridge sub-circuit board. The main body sub-circuit board further includes a second main body wiring layer at a second side of the first substrate, and a second main body insulating layer laminated on a side of the second main body wiring layer far away from the first substrate. A part of the first wiring portion is in the first main body wiring layer, and another part of the first wiring portion is in the second main body wiring layer. A part of the second wiring portion is in the first main body wiring layer, and another part of the second wiring portion is in the second main body wiring layer.

For example, in the flexible circuit board provided by at least one embodiment of the present disclosure, a part of the second functional wiring is in the first main body wiring layer, and another part of the second functional wiring is in the second main body wiring layer, or the second functional wiring is all in the first main body wiring layer. A part of the third functional wiring is in the first main body wiring layer, and another part of the third functional wiring is in the second main body wiring layer, or the third functional wiring is all in the second main body wiring layer.

For example, in the flexible circuit board provided by at least one embodiment of the present disclosure, the second functional wiring is all in the first main body wiring layer, and the third functional wiring is all in the second main body wiring layer.

For example, in the flexible circuit board provided by at least one embodiment of the present disclosure, the first main body insulating layer has a first via hole that exposes the first bridge connection end and the second bridge connection end.

For example, in the flexible circuit board provided by at least one embodiment of the present disclosure, at least a part of a wiring of the first wiring portion on the second main body wiring layer is electrically connected to the first main body wiring layer through a second via hole for electrically connecting to the bridge sub-circuit board through the first bridge connection end, and at least a part of a wiring of the second wiring portion on the second main body wiring layer is electrically connected to the first main body wiring layer through the second via hole for electrically connecting to the bridge sub-circuit board through the second bridge connection end.

For example, in the flexible circuit board provided by at least one embodiment of the present disclosure, the main body sub-circuit board includes a first main body wiring layer at a first side of the first substrate, and a first main body insulating layer laminated on a side of the first main body wiring layer far away from the first substrate. The main body sub-circuit board further includes a second main body wiring layer at a second side of the first substrate opposite to the first side thereof, and a second main body insulating layer laminated on a side of the second main body wiring layer far away from the first substrate. The first main body wiring layer includes the first wiring portion, the second wiring portion, and the first bridge connection end, the first bridge connection end is exposed by the first main body insulating layer. The second main body wiring layer includes the first wiring portion, the second wiring portion, and the second bridge connection end, the second bridge connection end is exposed by the second main body insulating layer.

For example, in the flexible circuit board provided by at least one embodiment of the present disclosure, the bridge sub-circuit board includes a first bridge wiring layer at a first side of the second substrate, and a first bridge insulating layer laminated on a side of the first bridge wiring layer far away from the second substrate, the first bridge wiring layer includes the third wiring portion.

For example, in the flexible circuit board provided by at least one embodiment of the present disclosure, the bridge sub-circuit board further includes a ground layer at a second side of the second substrate opposite to the first side thereof. When the bridge sub-circuit board is installed on the main body sub-circuit board, the second side is closer to the main body sub-circuit board than the first side.

For example, in the flexible circuit board provided by at least one embodiment of the present disclosure, the bridge sub-circuit board further includes a second bridge insulating layer laminated at a side of the ground layer far away from the second substrate. The second bridge insulating layer is provided with a plurality of openings exposing a part of the ground layer, and the plurality of openings serve as the third bridge connection end and/or the fourth bridge connection end for electrically connecting the bridge sub-circuit board to the main body sub-circuit board.

For example, in the flexible circuit board provided by at least one embodiment of the present disclosure, the bridge sub-circuit board further includes a shielding layer at the second side of the second substrate, and the shielding layer is laminated on a side of the ground layer far away from the second substrate.

For example, in the flexible circuit board provided by at least one embodiment of the present disclosure, the bridge sub-circuit board further includes a second bridge wiring layer at a second side of the second substrate opposite to the first side thereof, and a second bridge insulating layer laminated on a side of the second bridge wiring layer far away from the second substrate. The second bridge wiring layer includes the third wiring portion, the third bridge connection end, and the fourth bridge connection end. The third bridge connection end and the fourth bridge connection end are exposed by the second bridge insulating layer. When the bridge sub-circuit board is installed on the main body sub-circuit board, the second side is closer to the main body sub-circuit board than the first side.

For example, in the flexible circuit board provided by at least one embodiment of the present disclosure, the bridge sub-circuit board further includes a second bridge wiring layer at a second side of the second substrate opposite to the first side thereof, and a second bridge insulating layer laminated on a side of the second bridge wiring layer far away from the second substrate. The first bridge wiring layer further includes the third bridge connection end, which is exposed by the first bridge insulating layer. The second bridge wiring layer includes the third wiring portion and the fourth bridge connection end, and the fourth bridge connection end is exposed by the second bridge insulating layer.

For example, in the flexible circuit board provided by at least one embodiment of the present disclosure, the bridge sub-circuit board further includes a shielding layer at the second side of the second substrate and laminated on the side of the second bridge insulating layer far away from the second substrate.

For example, in the flexible circuit board provided by at least one embodiment of the present disclosure, the third bridge connection end and the fourth bridge connection end of the bridge sub-circuit board are respectively connected to the first bridge connection end and the second bridge connection end of the main body sub-circuit board through anisotropic conductive adhesives, soldering materials or connectors.

For example, in the flexible circuit board provided by at least one embodiment of the present disclosure, surfaces of the first bridge connection end and the second bridge connection end include tin materials. The third bridge connection end and the fourth bridge connection end of the bridge sub-circuit board are respectively welded to the first bridge connection end and the second bridge connection end of the main body sub-circuit board by the tin materials such that the bridge sub-circuit board is electrically connected to the main body sub-circuit board.

For example, in the flexible circuit board provided by at least one embodiment of the present disclosure, the main body sub-circuit board includes a plurality of first bridge connection ends and a plurality of second bridge connection ends. The bridge sub-circuit board may be in plural. A plurality of the bridge sub-circuit boards are installed on the main body sub-circuit board by respectively electrically connecting a plurality of the third bridge connection ends and a plurality of the fourth bridge connection ends to a plurality of the first bridge connection ends and a plurality of the second bridge connection ends.

For example, in the flexible circuit board provided by at least one embodiment of the present disclosure, the main body sub-circuit board further includes a terminal with a plurality of first contact pads thereon; an end of each of a plurality of wirings of the second wiring portion is electrically connected to each of some of the first contact pads in the terminal in one-to-one correspondence; an end of each of a plurality of wirings of the second functional wiring is electrically connected to each of some other of the first contact pads in the terminal in one-to-one correspondence; an end of each of a plurality of wirings of the third functional wiring is electrically connected to each of some further of the first contact pads in the terminal in one-to-one correspondence; some of the first contact pads respectively electrically connected to the second wiring portion, the third functional wiring and the second functional wiring are spaced apart in the terminal.

For example, in the flexible circuit board provided by at least one embodiment of the present disclosure, the terminal includes a structure on the second main body wiring layer.

For example, in the flexible circuit board provided by at least one embodiment of the present disclosure, the terminal is disposed in a wiring area of the main body sub-circuit board, and a transparency of the wiring area is higher than that of at least a part of an area outside the wiring area.

For example, in the flexible circuit board provided by at least one embodiment of the present disclosure, the wiring area only has a wiring layer and a part of an insulating layer.

For example, in the flexible circuit board provided by at least one embodiment of the present disclosure, the wiring area does not have a shielding layer.

For example, in the flexible circuit board provided by at least one embodiment of the present disclosure, the main body sub-circuit board further includes a terminal with a plurality of first contact pads; an end of each of a plurality of wirings of the second wiring portion is electrically connected to each of some of the first contact pads in the terminal in one-to-one correspondence; an end of each of a plurality of wirings of the second functional wiring is electrically connected to each of some other of the first contact pads in the terminal in one-to-one correspondence; an end of each of a plurality of wirings of the third functional wiring is electrically connected to each of some further of the first contact pads in the terminal in one-to-one correspondence; some of the first contact pads electrically connected to the second wiring portion, the third functional wiring and the second functional wiring are continuously arranged in the terminal.

For example, in the flexible circuit board provided by at least one embodiment of the present disclosure, the terminal includes a structure on the second main body wiring layer.

For example, in the flexible circuit board provided by at least one embodiment of the present disclosure, the terminal is disposed in a wiring area of the main body sub-circuit board, and a transparency of the wiring area is higher than that of at least a part of an area outside the wiring area.

For example, in the flexible circuit board provided by at least one embodiment of the present disclosure, the wiring area only has a wiring layer and a part of an insulating layer.

For example, in the flexible circuit board provided by at least one embodiment of the present disclosure, the wiring area does not have a shielding layer.

At least one embodiment of the present disclosure provides a flexible circuit board. The flexible circuit board includes: a main body sub-circuit board including a first substrate, and a first bridge connection end, a second bridge connection end, a first wiring portion and a second wiring portion on the first substrate, in which the first wiring portion and the second wiring portion are separated from each other and electrically connected to the first bridge connection end and the second bridge connection end, respectively; a bridge sub-circuit board including a second substrate, and a third bridge connection end, a fourth bridge connection end and a third wiring portion for a first functional wiring on the second substrate, in which the third bridge connection end and the fourth bridge connection end are electrically connected by the third wiring portion, the bridge sub-circuit board is configured to be installed on the main body sub-circuit board by respectively electrically connecting the third bridge connection end and the fourth bridge connection end to the first bridge connection end and the second bridge connection end, so that the first wiring portion, the third wiring portion and the second wiring portion are sequentially electrically connected to obtain the first functional wiring. An outline shape of the first substrate is different from that of the second substrate. The main body sub-circuit board includes a first main body wiring layer at a first side of the first substrate and a first main body insulating layer laminated on a side of the first main body wiring layer far away from the first substrate, the first side is a side of the main body sub-circuit board close to the bridge sub-circuit board. The main body sub-circuit board further includes a second main body wiring layer at a second side of the first substrate and a second main body insulating layer laminated on a side of the second main body wiring layer far away from the first substrate. A part of the first wiring portion is in the first main body wiring layer, and another part of the first wiring portion is in the second main body wiring layer. A part of the second wiring portion is in the first main body wiring layer, and another part of the second wiring portion is in the second main body wiring layer. The second functional wiring is all in the first main body wiring layer, and the third functional wiring is all in the second main body wiring layer. The first main body insulating layer has a first via hole exposing the first bridge connection end and the second bridge connection end. At least some of the wirings of the first wiring portion in the second main body wiring layer are electrically connected to the first main body wiring layer through the second via hole for electrically connecting to the bridge sub-circuit board through the first bridge connection end. At least some of the wirings of the second wiring portion in the second main body wiring layer are electrically connected to the first main body wiring layer through the second via hole for electrically connecting to the bridge sub-circuit board through the second bridge connection end. The bridge sub-circuit board includes a first bridge wiring layer at a first side of the second substrate and a first bridge insulating layer laminated on a side of the first bridge wiring layer far away from the second substrate, in which the first bridge wiring layer includes the third wiring portion. The bridge sub-circuit board further includes a ground layer at a second side of the second substrate opposite to the first side thereof. When the bridge sub-circuit board is installed on the main body sub-circuit board, the second side is closer to the main body sub-circuit board than the first side. The bridge sub-circuit board further includes a second bridge insulating layer laminated on a side of the ground layer far away from the second substrate, and the second bridge insulating layer is provided with a plurality of openings exposing a part of the ground layer, and the plurality of openings serve as the third bridge connection end and/or the fourth bridge connection end for electrically connecting the bridge sub-circuit board to the main body sub-circuit board.

At least one embodiment of the disclosure provides a display device. The display device includes a display panel and a flexible circuit board. The display panel is provided with pixel units arranged in an array and a touch driving wiring, a touch sensing wiring. The display panel further includes a second functional circuit structure which is a display circuit structure and is electrically connected to the pixel units. Second contact pads for electrically connecting to the flexible circuit board is also provided at a side of the display panel, some of the second contact pad are electrically connected to the second functional circuit, some other of the second contact pads are electrically connected to the touch driving wiring, and some further of the second contact pads are electrically connected to the touch sensing wiring. The some of the second contact pads electrically connected to the second functional circuit structure are between the some other of the second contact pads electrically connected to the touch driving wiring and the some further of the second contact pads electrically connected to the touch sensing wiring. The flexible circuit board includes a main body sub-circuit board and a bridge sub-circuit board. The main body sub-circuit board includes a first substrate, and a first bridge connection end, a second bridge connection end, a first wiring portion and a second wiring portion on the first substrate. The first wiring portion and the second wiring portion are separated from each other and respectively electrically connected to the first bridge connection end and the second bridge connection end. The bridge sub-circuit board includes a second substrate, and a third bridge connection end, a fourth bridge connection end and a third wiring portion for a first functional wiring on the second substrate. The third bridge connection end and the fourth bridge connection end are electrically connected by the third wiring portion. The bridge sub-circuit board is configured to be installed on the main body sub-circuit board by respectively electrically connecting the third bridge connection end and the fourth bridge connection end to the first bridge connection end and the second bridge connection end, so that the first wiring portion, the third wiring portion and the second wiring portion are sequentially electrically connected to obtain the first functional wiring. An outline shape of the first substrate is different from that of the second substrate. A terminal for electrically connecting to the display panel is also provided at a side of the main body sub-circuit board, and has a plurality of first contact pads. The main body sub-circuit board further includes a second functional wiring and a third functional wiring. The third functional wiring is between the first wiring portion and the second wiring portion. An orthographic projection of the third functional wiring on the first substrate at least partially overlaps with an orthographic projection of the bridge sub-circuit board on the first substrate. The first functional wiring of the main body sub-circuit board is electrically connected to the touch driving wiring of the display panel, and the second functional wiring of the main body sub-circuit board is electrically connected to the touch sensing wiring of the display panel, or the first functional wiring of the main body sub-circuit board is electrically connected to the touch sensing wiring of the display panel, and the second functional wiring of the main body sub-circuit board is electrically connected to the touch driving wiring of the display panel. The third functional wiring of the main body sub-circuit board is electrically connected to the second functional circuit structure of the display panel. The flexible circuit board further includes a first control circuit combination structure electrically connected to the first functional wiring, and also electrically connected to the second functional wiring. The touch driving wiring of the display panel is electrically connected to the first control circuit combination structure of the flexible circuit board through the first functional wiring, and the touch sensing wiring of the display panel is electrically connected to the first control circuit combination structure through the second functional wiring of the flexible circuit board; or the touch sensing wiring of the display panel is electrically connected to the first control circuit combination structure of the flexible circuit board through the first functional wiring, and the touch driving wiring of the display panel is electrically connected to the first control circuit combination structure through the second functional wiring of the flexible circuit board. The second contact pads of the display panel are electrically connected to the first contact pads of the flexible circuit board.

For example, in the display device provided by at least one embodiment of the present disclosure, the first control circuit combination structure is configured to provide a first electrical signal to the first functional wiring or receive a first electrical signal from the first functional wiring. The first control circuit combination structure is used to install a first control circuit, which is a touch driving IC chip.

For example, in the display device provided by at least one embodiment of the present disclosure, the first control circuit combination structure is further configured to provide a second electrical signal to the second functional wiring or receive a second electrical signal from the second functional wiring.

For example, in the display device provided by at least one embodiment of the present disclosure, the touch sensing wiring at least includes a part at a side of the display panel opposite to the second contact pads, and the touch driving wiring at least includes a part at any side except the two sides mentioned above.

For example, in the display device provided by at least one embodiment of the present disclosure, the first functional wiring electrically connected to the touch driving wiring is bridged by the bridge sub-circuit board, a distance between the touch driving wiring and the first control circuit combination structure is greater than a distance between the touch sensing wiring and the first control circuit combination structure, or alternatively, the first functional wiring electrically connected to the touch sensing wiring is bridged by the bridge sub-circuit board, the distance between the touch sensing wiring and the first control circuit combination structure is greater than the distance between the touch driving wiring and the first control circuit combination structure.

For example, in the display device provided by at least one embodiment of the present disclosure, the first control circuit combination structure is disposed on the main body sub-circuit board and electrically connected to the first wiring portion, or alternatively, the first control circuit combination structure is disposed on the bridge sub-circuit board and electrically connected to the third wiring portion. The first control circuit combination structure is configured to provide a first electrical signal to the first functional wiring or receive a first electrical signal from the first functional wiring.

For example, in the display device provided by at least one embodiment of the present disclosure, the main body sub-circuit board includes a first main body wiring layer at a first side of the first substrate and a first main body insulating layer laminated on a side of the first main body wiring layer far away from the first substrate, the first side is a side of the main body sub-circuit board near the bridge sub-circuit board. The main body sub-circuit board further includes a second main body wiring layer at a second side of the first substrate and a second main body insulating layer laminated on a side of the second main body wiring layer far away from the first substrate. A part of the first wiring portion is in the first main body wiring layer and another part of the first wiring portion is in the second main body wiring layer. A part of the second wiring portion is in the first main body wiring layer, and another part of the second wiring portion is in the second main body wiring layer.

For example, in the display device provided by at least one embodiment of the present disclosure, a part of the second functional wiring is in the first main body wiring layer, and another part of the second functional wiring is in the second main body wiring layer, or alternatively, the second functional wiring is all in the first main body wiring layer. A part of the third functional wiring is in the first main body wiring layer, and another part of the third functional wiring is in the second main body wiring layer, or the third functional wiring is all in the second main body wiring layer.

For example, in the display device provided by at least one embodiment of the present disclosure, the second functional wiring is all in the first main body wiring layer, and the third functional wiring is all in the second main body wiring layer.

For example, in the display device provided by at least one embodiment of the present disclosure, the first main body insulating layer has a first via hole exposing the first bridge connection end and the second bridge connection end.

For example, in the display device provided by at least one embodiment of the present disclosure, at least a part of a wiring of the first wiring portion on the second main body wiring layer is electrically connected to the first main body wiring layer through a second via hole, for electrically connecting to the bridge sub-circuit board through the first bridge connection end; and at least a part of a wiring of the second wiring portion on the second main body wiring layer is electrically connected to the first main body wiring layer through the second via hole, for electrically connecting to the bridge sub-circuit board through the second bridge connection end.

For example, in the display device provided by at least one embodiment of the present disclosure, the bridge sub-circuit board includes a first bridge wiring layer at a first side of the second substrate and a first bridge insulating layer laminated on a side of the first bridge wiring layer far away from the second substrate, the first bridge wiring layer includes the third wiring portion.

For example, in the display device provided by at least one embodiment of the present disclosure, the bridge sub-circuit board further includes a ground layer at a second side of the second substrate opposite to the first side. When the bridge sub-circuit board is installed on the main body sub-circuit board, the second side is closer to the main body sub-circuit board than the first side.

For example, in the display device provided by at least one embodiment of the present disclosure, the bridge sub-circuit board further includes a second bridge insulating layer laminated on a side of the ground layer far away from the second substrate. The second bridge insulating layer has a plurality of openings exposing a part of the ground layer, and the plurality of openings serve as the third bridge connection end and/or the fourth bridge connection end for electrically connecting the bridge sub-circuit board to the main body sub-circuit board.

For example, in the display device provided by at least one embodiment of the present disclosure, the bridge sub-circuit board further includes a shielding layer at the second side of the second substrate, and the shielding layer is laminated on a side of the ground layer far away from the second electrode plate.

For example, in the display device provided by at least one embodiment of the present disclosure, the third bridge connection end and the fourth bridge connection end of the bridge sub-circuit board are respectively connected to the first bridge connection end and the second bridge connection end of the main body sub-circuit board through anisotropic conductive adhesives, soldering materials or connectors.

For example, in the display device provided by at least one embodiment of the present disclosure, surfaces of the first bridge connection end and the second bridge connection end include tin materials. The third bridge connection end and the fourth bridge connection end of the bridge sub-circuit board are respectively welded to the first bridge connection end and the second bridge connection end of the main body sub-circuit board by tin materials to electrically connect the bridge sub-circuit board to the main body sub-circuit board.

For example, in the display device provided by at least one embodiment of the present disclosure, the main body sub-circuit board includes a plurality of first bridge connection ends and a plurality of second bridge connection ends. The bridge sub-circuit board may be provided as plural, and a plurality of the bridge sub-circuit boards are installed on the main body sub-circuit board by respectively electrically connecting to the plurality of first bridge connection ends and the plurality of second bridge connection ends through the plurality of third bridge connection ends and the plurality of fourth bridge connection ends.

For example, in the display device provided by at least one embodiment of the present disclosure, the main body sub-circuit board further includes a terminal with a plurality of first contact pads thereon; an end of each of a plurality of wirings of the second wiring portion is electrically connected to each of some of the first contact pads in the terminal in one-to-one correspondence; an end of each of a plurality of wirings of the second functional wiring is electrically connected to each of some other of the first contact pads in the terminal in one-to-one correspondence; an end of each of a plurality of wirings of the third functional wiring is electrically connected to each of some further of the first contact pads in the terminal in one-to-one correspondence; some of the first contact pads respectively electrically connected to the second wiring portion, the third functional wiring and the second functional wiring are spaced apart in the terminal.

For example, in the display device provided by at least one embodiment of the present disclosure, the terminal includes a structure on the second main body wiring layer.

For example, in the display device provided by at least one embodiment of the present disclosure, the terminal is disposed in a wiring area of the main body sub-circuit board, a transparency of the wiring area is higher than that of at least a part of an area outside the wiring area.

For example, in the display device provided by at least one embodiment of the present disclosure, the wiring area only has a wiring layer and a part of an insulating layer.

For example, in the display device provided by at least one embodiment of the present disclosure, the wiring area does not have a shielding layer.

For example, in the display device provided by at least one embodiment of the present disclosure, the main body sub-circuit board further includes a terminal with a plurality of first contact pads; an end of a plurality of wirings of the second wiring portion is electrically connected to each of some of the first contact pads in the terminal in one-to-one correspondence; an end of a plurality of wirings of the second functional wiring is electrically connected to each of some other of the first contact pads in the terminal in one-to-one correspondence; an end of a plurality of wirings of the third functional wiring is electrically connected to each of some further of the first contact pads in the terminal in one-to-one correspondence; some of the first contact pads electrically connected to the second wiring portion, the third functional wiring and the second functional wiring are continuously arranged in the terminal.

For example, in the display device provided by at least one embodiment of the present disclosure, the terminal includes a structure on the second main body wiring layer.

For example, in the display device provided by at least one embodiment of the present disclosure, the terminal is disposed in a wiring area of the main body sub-circuit board, a transparency of the wiring area is higher than that of at least a part of an area outside the wiring area.

For example, in the display device provided by at least one embodiment of the present disclosure, the wiring area only has a wiring layer and a part of an insulating layer.

For example, in the display device provided by at least one embodiment of the present disclosure, the wiring area does not have a shielding layer.

For example, in the display device provided by at least one embodiment of the present disclosure, the display device further includes a second control circuit combination structure.

For example, in the display device provided by at least one embodiment of the present disclosure, the second control circuit is configured to provide a third electrical signal to the third functional wiring or receive a third electrical signal from the third functional wiring.

For example, in the display device provided by at least one embodiment of the present disclosure, the second control circuit combination structure is configured to install a second control circuit, and the second control circuit is a driving IC chip.

For example, in the display device provided by at least one embodiment of the present disclosure, the bridge sub-circuit board is connected to the third functional wiring, the first wiring portion and the second wiring portion pass under the bridge sub-circuit board for connection.

At least one embodiment of the present disclosure provides a display device including a display panel and a flexible circuit board. The display panel is provided with pixel units arranged in an array, a touch driving wiring and a touch sensing wiring. The display panel further includes a second functional circuit structure which is a display circuit structure and is electrically connected to the pixel units. Second contact pads for electrically connecting to the flexible circuit board are provided on a side of the display panel. Some of the second contact pads are electrically connected to the second functional circuit, some other of the second contact pads are electrically connected to the touch driving wiring, and some further of the second contact pads are electrically connected to the touch sensing wiring. The some of the second contact pads electrically connected to the second functional circuit structure are between the some other of the second contact pads electrically connected to the touch driving wiring and the some further of the second contact pads electrically connected to the touch sensing wiring. The flexible circuit board includes a main body sub-circuit board and a bridge sub-circuit board. The main body sub-circuit board includes a first substrate, and a first bridge connection end, a second bridge connection end, a first wiring portion and a second wiring portion on the first substrate. The first wiring portion and the second wiring portion are separated from each other and electrically connected to the first bridge connection end and the second bridge connection end, respectively. The bridge sub-circuit board includes a second substrate, and a third bridge connection end, a fourth bridge connection end and a third wiring portion for first functional wiring on the second substrate. The third bridge connection end and the fourth bridge connection end are electrically connected by the third wiring portion. The bridge sub-circuit board is configured to be installed on the main body sub-circuit board by respectively electrically connecting the third bridge connection end and the fourth bridge connection end to the first bridge connection end and the second bridge connection end, so that the first wiring portion, the third wiring portion and the second wiring portion are sequentially electrically connected to obtain the first functional wiring. An outline shape of the first substrate is different from that of the second substrate. The main body sub-circuit board includes a first main body wiring layer at a first side of the first substrate and a first main body insulating layer laminated on a side of the first main body wiring layer far away from the first substrate, the first side is a side of the main body sub-circuit board close to the bridge sub-circuit board. The main body sub-circuit board also includes a second main body wiring layer at a second side of the first substrate and a second main body insulating layer laminated on a side of the second main body wiring layer far away from the first substrate. A part of the first wiring portion is in the first main body wiring layer, and another part of the first wiring portion is in the second main body wiring layer. A part of the second wiring portion is in the first main body wiring layer, and another part is in the second main body wiring layer. The second functional wiring is all in the first main body wiring layer, and the third functional wiring is all in the second main body wiring layer. The first main body insulating layer has a first via hole exposing the first bridge connection end and the second bridge connection end. At least a part of a wiring of the first wiring portion on the second main body wiring layer is electrically connected to the first main body wiring layer through a second via hole for electrically connecting to the bridge sub-circuit board through the first bridge connection end, and at least a part of a wiring of the second wiring portion on the second main body wiring layer is electrically connected to the first main body wiring layer through the second via hole for electrically connecting to the bridge sub-circuit board through the second bridge connection end. The first main body wiring layer includes the first wiring portion, the second wiring portion, the first bridge connection end and the second bridge connection end. The first bridge connection end and the second bridge connection end are exposed by the first main body insulating layer. The main body sub-circuit board also includes a second main body wiring layer at a second side of the first substrate opposite to the first side, and a second main body insulating layer laminated on a side of the second main body wiring layer far away from the first substrate. The second main body wiring layer includes the first wiring portion and the second wiring portion. The bridge sub-circuit board includes a first bridge wiring layer at a first side of the second substrate and a first bridge insulating layer laminated on a side of the first bridge wiring layer far away from the second substrate. The first bridge wiring layer includes the third wiring portion. The bridge sub-circuit board also includes a ground layer at a second side of the second substrate opposite to the first side thereof. When the bridge sub-circuit board is installed on the main body sub-circuit board, the second side is closer to the main body sub-circuit board than the first side. The bridge sub-circuit board also includes a second bridge insulating layer laminated on a side of the ground layer far away from the second substrate. The second bridge insulating layer is provided with a plurality of openings exposing part of the ground layer, and the plurality of openings serve as the third bridge connection end and/or the fourth bridge connection end for electrically connecting the bridge sub-circuit board to the main body sub-circuit board. A terminal for electrically connecting to the display panel is also provided at a side of the main body sub-circuit board, and has a plurality of first contact pads. The main body sub-circuit board also includes a second functional wiring and a third functional wiring. The third functional wiring is between the first wiring portion and the second wiring portion. An orthographic projection of the third functional wiring on the first substrate at least partially overlaps with an orthographic projection of the bridge sub-circuit board on the first substrate. The first functional wiring of the main body sub-circuit board is electrically connected to the touch driving wiring of the display panel. The second functional wiring of the main body sub-circuit board is electrically connected to the touch sensing wiring of the display panel. The third functional wiring of the main body sub-circuit board is electrically connected to a second functional circuit structure of the display panel. The flexible circuit board also includes a first control circuit combination structure. The first control circuit combination structure is electrically connected to the first functional wiring, and also electrically connected to the second functional wiring. The touch driving wiring of the display panel is electrically connected to the first control circuit combination structure of the flexible circuit board through the first functional wiring. The touch sensing wiring of the display panel is electrically connected to the first control circuit combination structure through the second functional wiring of the flexible circuit board, and the second contact pads of the display panel and the first contact pads of the flexible circuit board are electrically connected.

For example, in the display device provided by at least one embodiment of the present disclosure, the bridge sub-circuit board is connected to the third functional wiring, and the first wiring portion and the second wiring portion pass under the bridge sub-circuit board for connection.

At least one embodiment of the disclosure provides a manufacturing method of a flexible circuit board. The manufacturing method includes: providing a main body sub-circuit board, in which the main body sub-circuit board includes a first substrate, and a first bridge connection end, a second bridge connection end, a first wiring portion and a second wiring portion on the first substrate, the first wiring portion and the second wiring portion are separated from each other and respectively electrically connected to the first bridge connection end and the second bridge connection end; providing a bridge sub-circuit board, in which the bridge sub-circuit board includes a second substrate, and a third bridge connection end, a fourth bridge connection end and a third wiring portion for a first functional wiring on the second substrate, the third bridge connection end and the fourth bridge connection end are electrically connected by the third wiring portion, electrically connecting the third bridge connection end and the fourth bridge connection end of the bridge sub-circuit board respectively to the first bridge connection end and the second bridge connection end of the main body sub-circuit board, so that the bridge sub-circuit board is installed on the main body sub-circuit board; and the first substrate is not in direct contact with the second substrate.

For example, in the manufacturing method provided by at least one embodiment of the present disclosure, the third bridge connection end and the fourth bridge connection end of the bridge sub-circuit board are respectively connected to the first bridge connection end and the second bridge connection end of the main body sub-circuit board by hot pressing, welding or connectors.

At least one embodiment of the present disclosure provides a circuit board structure including a main circuit board, a transfer circuit board, and a connector. The main circuit board has a double circuit layer structure and carries the main board lapping end. The transfer circuit board has a double circuit layer structure, laminated on the main circuit board and carries a first element lapping end for lapping a first element set, a first leading wire set connected to the first element lapping end, and a transfer board lapping end connected to the first leading wire set. The connector is disposed between the main circuit board and the transfer circuit board for connecting the main board lapping end and the transfer board lapping end.

For example, in the circuit board structure provided by at least one embodiment of the present disclosure, the circuit board structure further includes a shielding layer which is laminated between the main circuit board and the transfer circuit board.

For example, in the circuit board structure provided by at least one embodiment of the present disclosure, the main circuit board further carries a second leading wire set. An orthographic projection of the transfer circuit board on the main circuit board at least covers a part of the second leading wire set.

For example, in the circuit board structure provided by at least one embodiment of the present disclosure, the main circuit board further carries a first group of external pins. A part of the first group of external pins are connected to the main board lapping end to connect the part of the first leading wire set, and a part of the first group of external pins are connected to the second leading wire set.

For example, in the circuit board structure provided by at least one embodiment of this disclosure, the main board lapping end includes a plurality of main sub-board lapping ends, the transfer board lapping end includes a plurality of transfer sub-board lapping ends, and the connector is in plural. The main sub-board lapping ends are connected to the lapping sub-board lapping ends through a plurality of the connectors in one-to-one correspondence.

For example, in the circuit board structure provided by at least one embodiment of the present disclosure, the number of the main sub-board lapping ends is two, and these two main sub-board lapping ends are respectively arranged at opposite sides of the second leading wire set.

For example, in the circuit board structure provided by at least one embodiment of the present disclosure, the main circuit board further carries a second group of external pins; a part of the second external pin set is connected to the second leading wire set, and a part of the second external pin set is connected to the main board lapping end to connect a part of the first leading wire set.

For example, in the circuit board structure provided by at least one embodiment of the present disclosure, at least one of the main circuit board and the transfer circuit board is a flexible circuit board.

For example, in the circuit board structure provided by at least one embodiment of the present disclosure, the main circuit board includes a first substrate, and a circuit layer at a side of the first substrate or circuit layers at two sides of the first substrate. The transfer circuit board includes a second substrate, and a circuit layer at a side of the second substrate or circuit layers at two sides of the second substrate.

At least one embodiment of the present disclosure provides a display panel including the above-mentioned circuit board structure.

The present disclosure provides a circuit board structure and a display panel thereof. The circuit board structure includes a main circuit board, a transfer circuit board and a connector. The main circuit board has a double circuit layer structure and carries a main board lapping end. The transfer circuit board has a double circuit layer structure laminated on the main circuit board and carries a first element lapping end for lapping a first element set, a first leading wire set connected to the first element lapping end, and a transfer board lapping end connected to the first leading wire set. A connector is arranged between the main circuit board and the transfer circuit board, for connecting the main board lapping end and the transfer board lapping end. In the circuit board structure provided by the present disclosure, two circuit layers may be provided on the main circuit board and the transfer circuit board. On the one hand, the circuit board structure provided by the present disclosure can reduce the occupied space of the circuit board structure by a laminated arrangement of the double circuit layer circuit board; and on the other hand, the double circuit layer circuit board has mature manufacturing process and simple structural design, so as to reduce the design cost of the circuit board.

It should be understood that the above general description and the following detailed description are only exemplary and explanatory, and do not limit the present disclosure.

BRIEF DESCRIPTION OF THE DRAWINGS

A brief introduction will be made below to the accompanying drawings required for the description of embodiments or the prior art, in order to illustrate technical solutions in embodiments of the present disclosure or in the prior art more clearly. Apparently, the drawings in the following description are only some embodiments of the present disclosure, but do not limit this disclosure. The accompanying drawings, which are incorporated in and constitute a part of this specification, illustrate embodiments consistent with the present disclosure and together with the description, serve to explain the principles of the present disclosure. It is apparent that the accompanying drawings in the following description are only some of the embodiments of the present disclosure, and other drawings may be obtained from these accompanying drawings by those skilled in the art without any creative work.

DETAILED DESCRIPTION

Figure 1A:
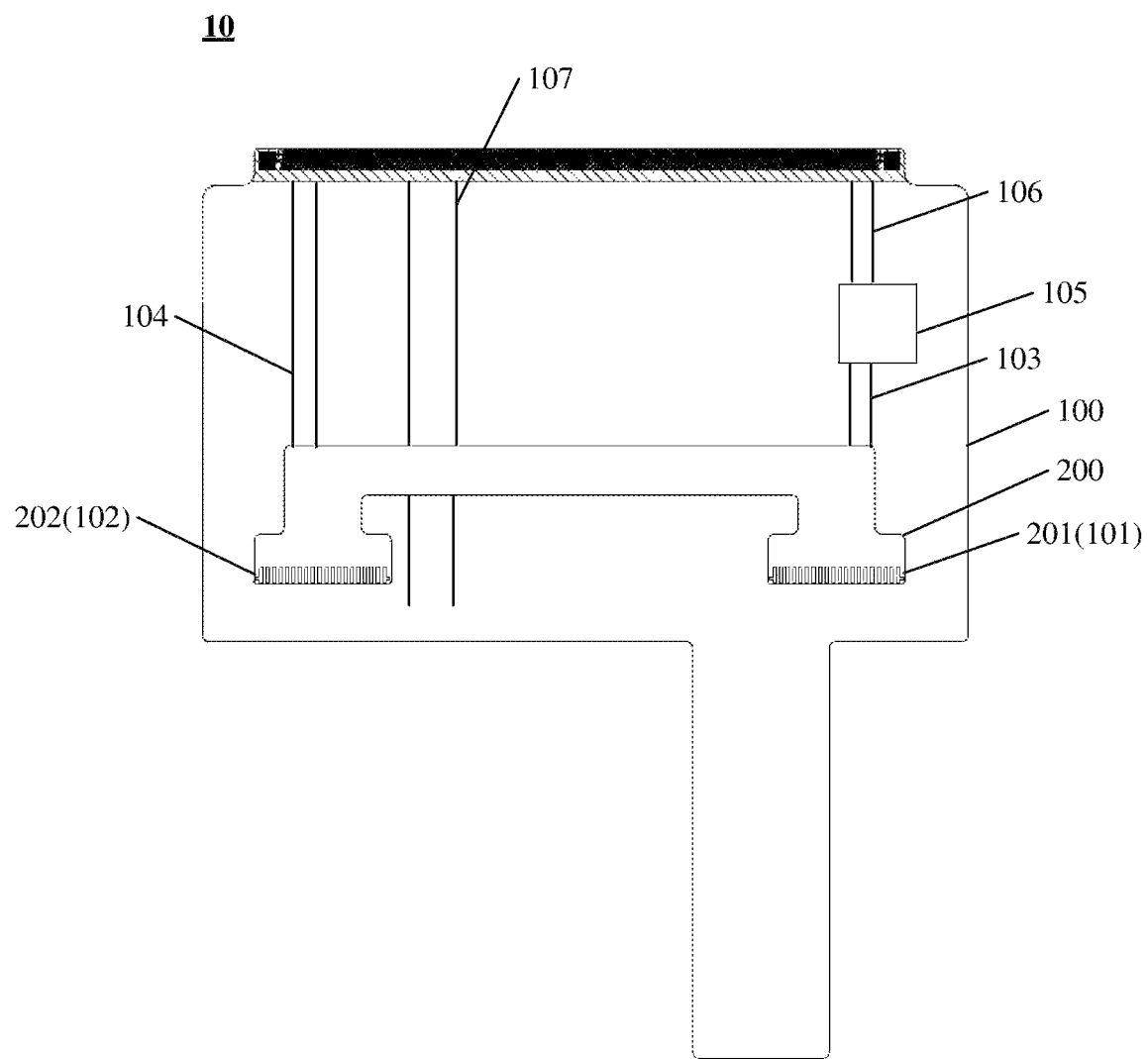
FIG. 1A is a schematic plan view of a flexible circuit board provided by at least one embodiment of the present disclosure.

In order to make objects, technical solutions and advantages of the embodiments of the present disclosure more apparent, the technical solutions of the embodiments of the present disclosure will be described clearly and completely in combination with the accompanying drawings of the embodiments of the present disclosure. Obviously, the described embodiments are merely a part of the embodiments, but not all of the embodiments of the present disclosure. Based on the described embodiments of this disclosure, Other embodiments obtained by the person skilled in the art without any creative effort are within the scope of the present disclosure.

Unless otherwise defined, technical terms or scientific terms used in this disclosure should be general meanings as comprehended by the person with ordinary skill in the art of the present disclosure. The "first", "second" and similar words used in the present disclosure do not refer to any order, number, or importance, but only used to distinguish the different components. The "include" or comprise" and similar words refer to the elements or articles prior to the word and encompass the elements or articles and their equivalents posterior to the word, and other elements or articles are included. The word "connect" and the like are not limited to physical or mechanical connection, but may include electrical connection, no matter whether direct or indirect.

Now, the exemplary embodiments will be described more fully with reference to the accompanying drawings. However, the exemplary embodiments can be embodied in a variety of forms and should not be construed as limiting the embodiments set forth herein. Instead, these embodiments are provided so that the present disclosure will be thorough and complete, and the concepts of the exemplary embodiments will be fully given to those skilled in the art. Same reference numbers denote the same or similar structures in the figures, and thus the detailed description thereof will be omitted.

Although relative terms such as "above" and "under" are used herein to describe the relationship of one component relative to another component, such terms are used herein only for the sake of convenience, for example, in the direction shown in the figure, it should be understood that if the referenced device is inversed upside down, a component described as "above" will become a component described as "under". Other relative terms, such as "high", "low", "top", "bottom", "left" and "right" have similar meanings. When a structure is described as "above" another structure, it probably means that the structure is integrally formed on another structure, or, the structure is "directly" disposed on another structure, or the structure is "indirectly" disposed on another structure through an additional structure.

Various signal wirings may be generally integrated in the flexible circuit board for transmitting different types of signals. When there are many types of signal wirings on the flexible circuit board, such as various types of signal wirings for display signals, touch signals, fingerprint identification signals, or the like, the difficulty of wiring in the flexible circuit board will be increased. Therefore, the flexible circuit board is usually formed to have multiple wiring layers, for example, four or six wiring layers, so as to provide convenience for the arrangement of various types of wirings, so that various types of wirings may be distributed on different layers to reduce the mutual interference between different types of wirings. However, in a process of manufacturing a flexible circuit board with multiple wiring layers, it is necessary to form insulating layers (and corresponding adhesive layers) between adjacent ones of the wiring layers, and if necessary, it is also necessary to form a shielding layer (an electromagnetic signal) between different wirings in order to avoid signal crosstalk between different wirings, which all increase the manufacturing difficulty of the flexible circuit board.

At least one embodiment of the present disclosure provides a flexible circuit board. The flexible circuit board includes a first substrate, as well as a main body sub-circuit board and a bridge sub-circuit board arranged on the first substrate. The main body sub-circuit board includes a first bridge connection end, a second bridge connection end, a first wiring portion and a second wiring portion. The first wiring portion and the second wiring portion are separated from each other and electrically connected to the first bridge connection end and the second bridge connection end, respectively. The bridge sub-circuit board includes a second substrate, as well as a third bridge connection end, a fourth bridge connection end and a third wiring portion arranged on the second substrate. The third bridge connection end and the fourth bridge connection end are electrically connected by the third wiring portion, and the first substrate is not in direct contact with the second substrate. The bridge sub-circuit board is configured to be installed on the main body sub-circuit board by electrically connecting the third bridge connection end and the fourth bridge connection end to the first bridge connection end and the second bridge connection end, respectively.

An electronic device module provided by at least one embodiment of the present disclosure includes an electronic device substrate and the above-mentioned flexible circuit board. The electronic device substrate includes a first functional circuit structure, and the first functional wiring of the flexible circuit board is electrically connected to the first functional circuit structure.

At least one embodiment of the present disclosure provides a display device including the above-mentioned electronic device module.

The flexible circuit board, the manufacturing method thereof, and the display device of the present disclosure will be described in following several specific embodiments.

Some embodiments of the present disclosure provide a flexible circuit board, and FIG. 1A is a schematic plan view of the flexible circuit board. As shown in FIG. 1A, the flexible circuit board 10 includes a main body sub-circuit board 100 and a bridge sub-circuit board 200 which may be electrically connected to the main body sub-circuit board 100.

Figure 2:
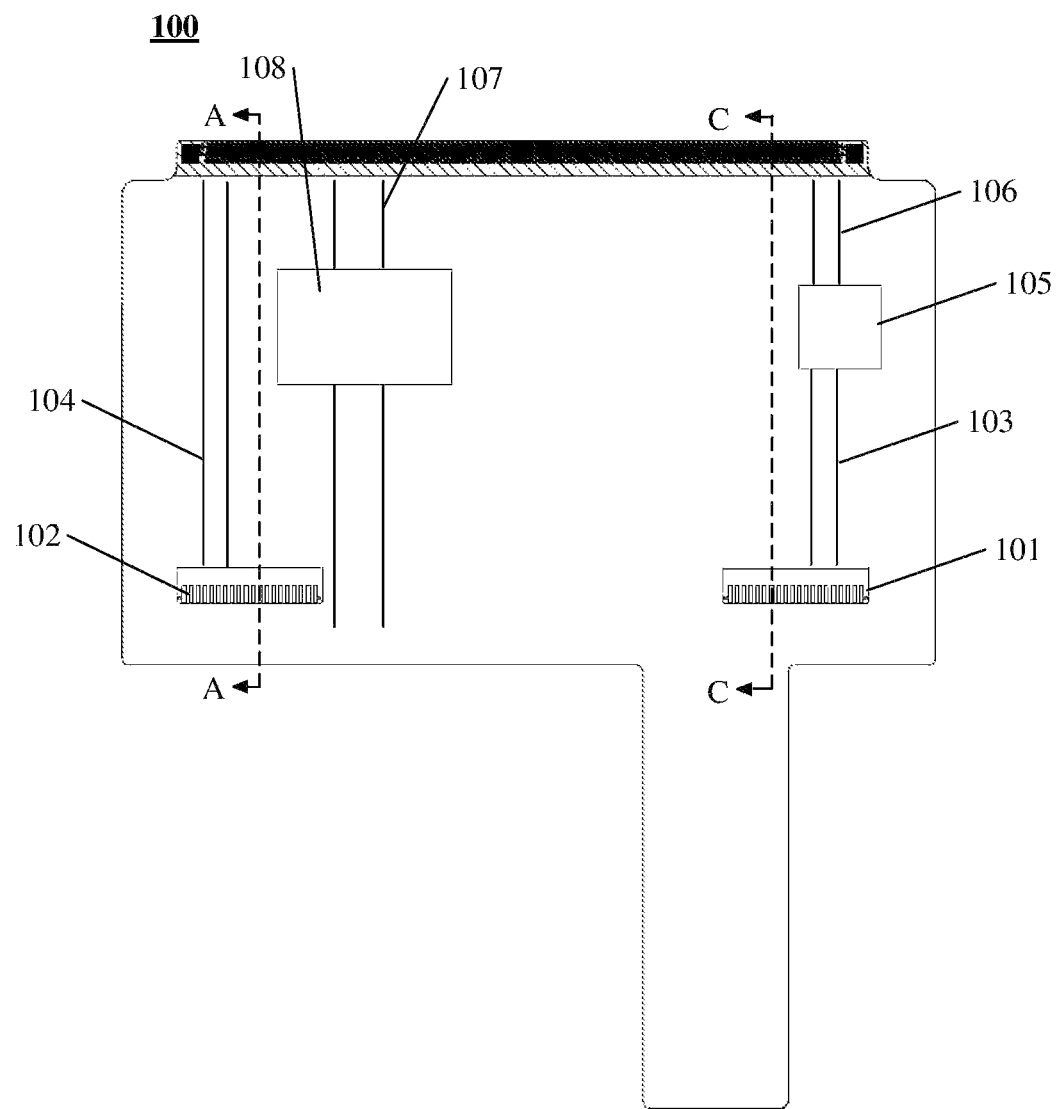
FIG. 2 is a schematic plan view of a main body sub-circuit board of a flexible circuit board provided by at least one embodiment of the present disclosure.

FIG. 2 is a schematic plan view of the main body sub-circuit board 100. As shown in FIG. 2, the main body sub-circuit board 100 includes a first substrate, as well as a first bridge connection end 101, a second bridge connection end 102, a first wiring portion 103 and a second wiring portion 104 arranged on the first substrate. The first wiring portion 103 and the second wiring portion 104 are separated from each other by a predetermined space (distance), and are electrically connected to the first bridge connection end 101 and the second bridge connection end 102, respectively. For example, the first bridge connection end 101 includes a plurality of first contact pads, and the second bridge connection end 102 includes a plurality of second contact pads. For example, the first wiring portion 103 includes a plurality of wirings, an end of each of the wirings is electrically connected to each of a plurality of first contact pads of the first bridge connection end 101 in one-to-one correspondence. The second wiring portion 104 also includes a plurality of wirings, and an end of each of the wirings is electrically connected to each of a plurality of second contact pads of first bridge connection end 102 in one-to-one correspondence. Two wirings of the first wiring portion 103 and two wirings of the second wiring portion 104 are merely shown in the figure, the embodiments of the present disclosure are not limited thereto.

Figure 3:
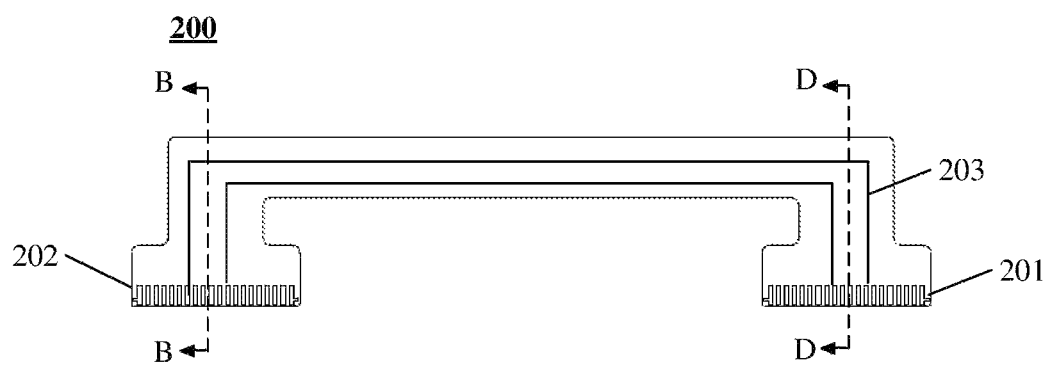
FIG. 3 is a schematic plan view of a bridge sub-circuit board of a flexible circuit board provided by at least one embodiment of the present disclosure.

FIG. 3 is a schematic plan view of the bridge sub-circuit board 200. As shown in FIG. 3, the bridge sub-circuit board 200 includes a second substrate, and a third bridge connection end 201, a fourth bridge connection end 202 and a third wiring portion 203 arranged on the second substrate. The third bridge connection end 201 and the fourth bridge connection end 202 are electrically connected by the third wiring portion 203. For example, the third bridge connection end 201 includes a plurality of third contact pads, the fourth bridge connection end 202 includes a plurality of fourth contact pads, and the third wiring portion 203 includes a plurality of wirings. These wirings are electrically connected at ends thereof to a plurality of third contact pads of the third bridge connection end 201 in one-to-one correspondence, and are electrically connected at another ends thereof to a plurality of fourth contact pads of the fourth bridge connection end 202 in one-to-one correspondence. Although only two wirings of the third wiring portion 203 are shown in the figure, embodiments of the present disclosure are not limited thereto.

The bridge sub-circuit board 200 is configured to be installed on the main body sub-circuit board 100 by electrically connecting the third bridge connection end 201 and the fourth bridge connection end 202 to the first bridge connection end 101 and the second bridge connection end 102, respectively. When the bridge sub-circuit board 200 is installed on the main body sub-circuit board 100, the first wiring portion 103, the third wiring portion 203, and the second wiring portion 104 are sequentially electrically connected to obtain the first functional wiring. Therefore, electrical signals may be transmitted from the first wiring portion 103 to the second wiring portion 104 via the third wiring portion 203, or may be transmitted from the second wiring portion 104 to the first wiring portion 103 via the third wiring portion 203.

In some embodiments, an outline shape of the bridge sub-circuit board 200 is a symmetrical structure.

For example, FIG. 1A shows that a bridge sub-circuit board 200 is installed on a main body sub-circuit board 100 by engaging a third bridge connection end 201 and a fourth bridge connection end 202 with a first bridge connection end 101 and a second bridge connection end 102, respectively. In some embodiments, the main body sub-circuit board 100 and the bridge sub-circuit board 200 may also be in a state to be connected, that is, the individual main body sub-circuit board 100 and bridge sub-circuit board 200 are also within the protection scope of this disclosure.

For example, in some embodiments, as shown in FIG. 2, the flexible circuit board 10 may further include a first control circuit combination structure 105 disposed on the main body sub-circuit board 100. For example, the first control circuit combination structure 105 includes a plurality of contact pads for installing the first control circuit, and a part of the contact pads are electrically connected to another ends of a plurality of wirings of the first wiring portion 103 in one-to-one correspondence. The first control circuit combination structure 105 is configured to provide a first electrical signal to the first functional wiring or receive a first electrical signal from the first functional wiring.

The first control circuit may be, for example, a driving IC chip. The driving IC chip with the flexible circuit board in many manners (i.e., package manner), such as tape carrier package (TCP), chip on film (COF) package and the like. In the TCP manner, the flexible circuit board includes a plurality of contact pads; and a plurality of pins of the driving IC chip are welded (for example, by eutectic welding) to a plurality of contact pads of the flexible circuit board in one-to-one correspondence, or are electrically connected in one-to-one correspondence by anisotropic conductive adhesives (ACF), and at least the welded part is protected by, for example, epoxy resin. In order to increase the flexibility of flexible circuit board in the TCP mode, a slit may be formed in the packaged part. In the COF packaging mode, the flexible circuit board includes a plurality of contact pads; and a plurality of pins of the driving IC chip are directly pressure-molded on a plurality of contact pads of flexible circuit board through ACF, so that the pins of driving IC chip are electrically connected to the contact pads of flexible circuit board in one-to-one correspondence. For example, the size and arrangement of the contact pads on the flexible circuit board for bonding the driving IC chips may be adjusted according to different types of packaging methods or the driving IC chips to be packaged, for example, these contact pads may be arranged in a long strip or rectangular shape. The embodiment of the present disclosure does not limit the packaging mode of the driving IC chip.

For example, in some embodiments, as shown in FIG. 2, the main body sub-circuit board 100 of the flexible circuit board 10 may further include a second functional wiring 106 with a plurality of wirings. Some other of the contact pads in the first control circuit combination structure 105 are electrically connected to a plurality of wirings of the second functional wiring 106 in one-to-one correspondence. At this time, the first control circuit installed on the first control circuit combination structure 105 is also configured to provide a second electrical signal to the second functional wiring 106 or receive a second electrical signal from the second functional wiring 106.

For example, in some embodiments, as shown in FIGS. 1A and 2, the main body sub-circuit board 100 of the flexible circuit board 10 further includes a third functional wiring 107 that is located between the first wiring portion 103 and the second wiring portion 104, thereby passing through a predetermined space between the first wiring portion 103 and the second wiring portion 104, for example, the third functional wiring 107 intersects the bridge sub-circuit board 200 installed on the main body sub-circuit board 100 in a direction perpendicular to a board surface of the main body sub-circuit board 100. At this time, the third wiring portion 203 on the bridge sub-circuit board 200 across the third functional wiring 107 to electrically connect to the first wiring portion 103 and the second wiring portion 104 at both sides of the main body sub-circuit board 100, to avoid the intersected wirings from forming on the main body sub-circuit board 100 itself, and further avoid or weaken the signal crosstalk between different wirings, or avoid the addition of additional functional layers for preventing the signal crosstalk, thus avoid the complexity of the circuit board structure. In addition, this design may simplify the wiring layout of the main body sub-circuit board 100, and make the manufacturing process of main body sub-circuit board simplified.

For example, in some embodiments, as shown in FIG. 2, the first wiring portion 103, the second wiring portion 104, and the third functional wiring 107 are wired in the same direction, such as in parallel or substantially in parallel (as long as the wirings are not intersected), for example parallel wirings in the vertical direction as shown in the figures. Therefore, the above-mentioned wirings on the main body sub-circuit board 100 have no intersecting parts, and the wiring layout is simpler. For example, in some embodiments, these wirings may be arranged in the same wiring layer, to reduce the number of wiring layers and simplify a layered structure of the flexible circuit board.

Figure 1B:
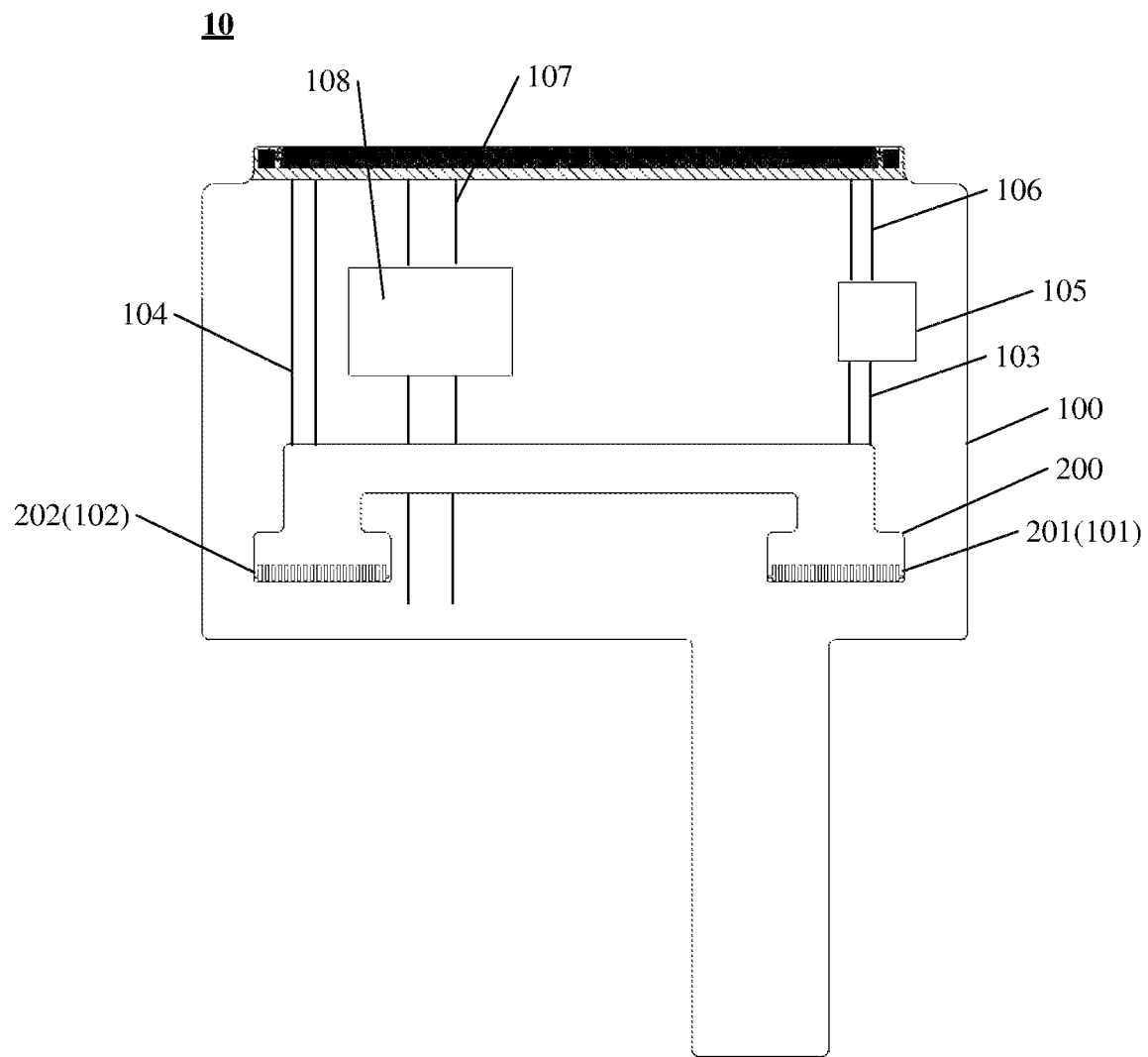
FIG. 1B is a schematic plan view of a flexible circuit board provided by at least one embodiment of the present disclosure.

For example, in some embodiments, as shown in FIGS. 1B and 2, the flexible circuit board 10 may further include a second control circuit combination structure 108 disposed on the main body sub-circuit board 100. For example, the second control circuit combination structure 108 includes a plurality of contact pads for installing the second control circuit, and at least some of the contact pads are electrically connected to the end of the third functional wiring 107 in one-to-one correspondence. The second control circuit combination structure 108 is configured to provide a third electrical signal to the third functional wiring 107 or receive a third electrical signal from the third functional wiring 107. For example, the third functional wiring 107 is divided into two parts, in which a first part of the third functional wiring 107 is electrically connected to a first end (shown as a lower end in the figure) of the second control circuit combination structure 108, and a second part of the third functional wiring 107 is electrically connected between a second end (shown as an upper end in the figure) of the second control circuit bonding structure 108 and the contact pad (as described below) formed on a side edge of the main body sub-circuit board 100.

For example, the second control circuit may also be a driving IC chip. The first control circuit and the second control circuit are respectively used for realizing different driving functions. As mentioned above, the driving IC chip is combined with the flexible circuit board in a manner, such as, a tape carrier package (TCP), a chip on film (COF) package, or the like. For example, the second control circuit bonding structure 108 includes a plurality of contact pads for connecting with the driving IC chip. Similarly, the size and arrangement of these contact pads may be adjusted according to different types of packaging methods or driving IC chips to be packaged, which is not specifically limited by the embodiments of this disclosure.

Figure 4A:
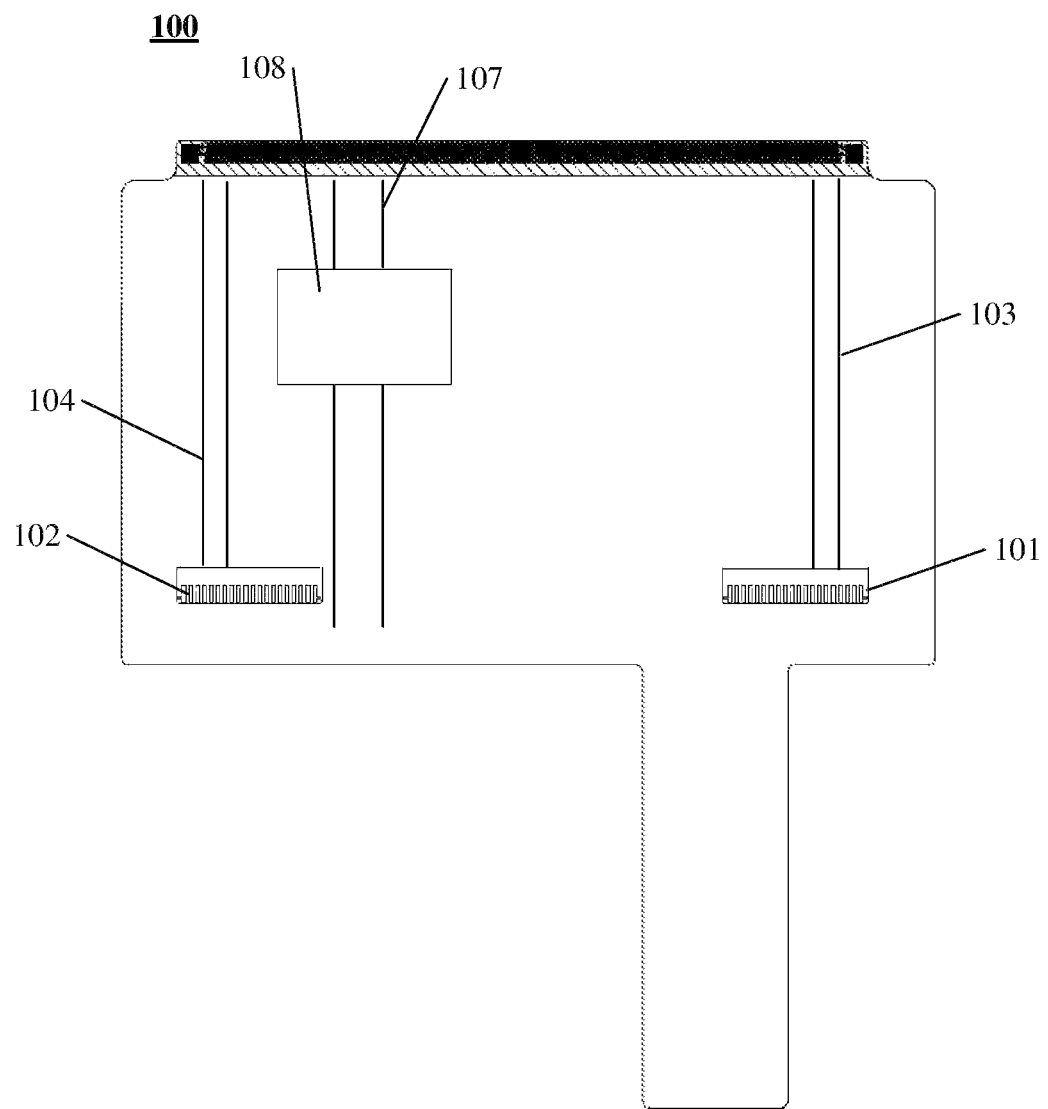
FIG. 4A is a schematic plan view of a main body sub-circuit board of a flexible circuit board provided by at least one embodiment of the present disclosure.
Figure 4B:
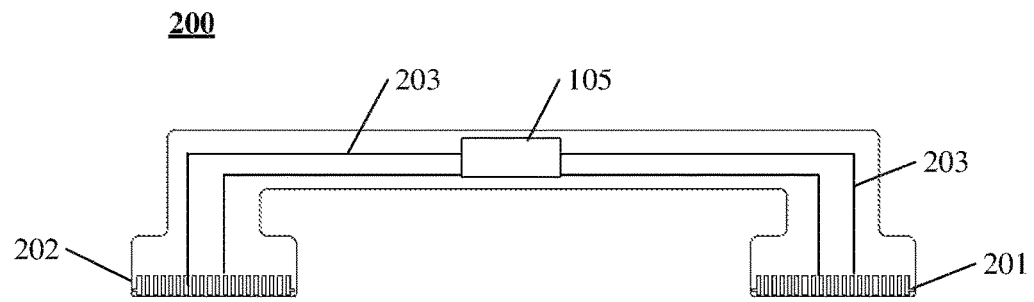
FIG. 4B is a schematic plan view of a bridge sub-circuit board of a flexible circuit board provided by at least one embodiment of the present disclosure.

For example, as shown in FIG. 4A and FIG. 4B, in some embodiments, the first control circuit combination structure 105 may also be formed on the bridge sub-circuit board 200. At this time, on the main body sub-circuit board 100, the first wiring portion 103 and the second wiring portion 104 are electrically connected to the first bridge connection end 101 and the second bridge connection end 102, respectively; and on the bridge sub-circuit board 200, the third wiring portion 203 is divided into two parts, in which a first part of the third wiring portion 203 is electrically connected between the first control circuit combination structure 105 and the third bridge connection end 201, and a second part of the third wiring portion 203 is electrically connected between the first control circuit combination structure 105 and the fourth bridge connection end 202. Therefore, the first wiring portion 103 and the second wiring portion 104 on the main body sub-circuit board 100 are electrically connected to the first control circuit combination structure 105 on the bridge sub-circuit board 200, respectively.

Figure 1C:
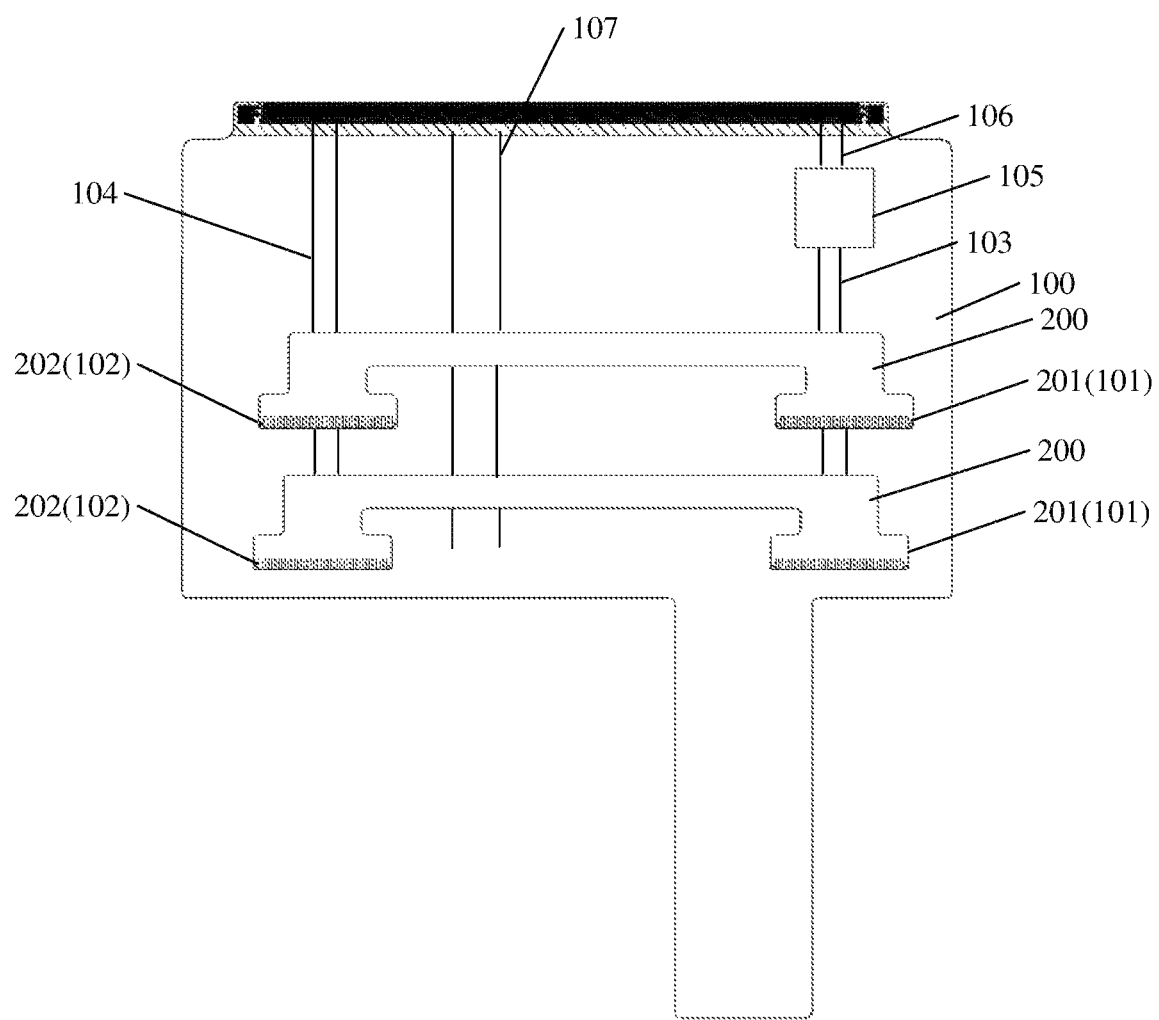
FIG. 1C is a schematic plan view of a flexible circuit board provided by at least one embodiment of the present disclosure.

For example, in some embodiments, as shown in FIG. 1C, the bridge sub-circuit board 200 may be provided to be plural (for example, two bridge sub-circuit boards are shown in the figure), and at this time, a plurality of the bridge sub-circuit boards 200 may be simultaneously installed on the main body sub-circuit board 100. For example, the main body sub-circuit board 100 includes a plurality of first bridge connection ends 101 and a plurality of second bridge connection ends 102. A plurality of the bridge sub-circuit boards 200 are respectively electrically connected to a plurality of first bridge connection ends 101 and a plurality of second bridge connection ends 102 through a plurality of third bridge connection ends 201 and a plurality of fourth bridge connection ends 202 thereon, so as to be installed on the main body sub-circuit board 100.

It should be noted that, in the embodiment shown in FIG. 1C, two bridge sub-circuit boards 200 are provided, however, the embodiment of the present disclosure is not limited thereto, that is, the number of bridge sub-circuit boards 200 may be selected according to actual requirements, and the embodiments of the present disclosure do not limit the number of bridge sub-circuit boards 200.

Figure 1D:
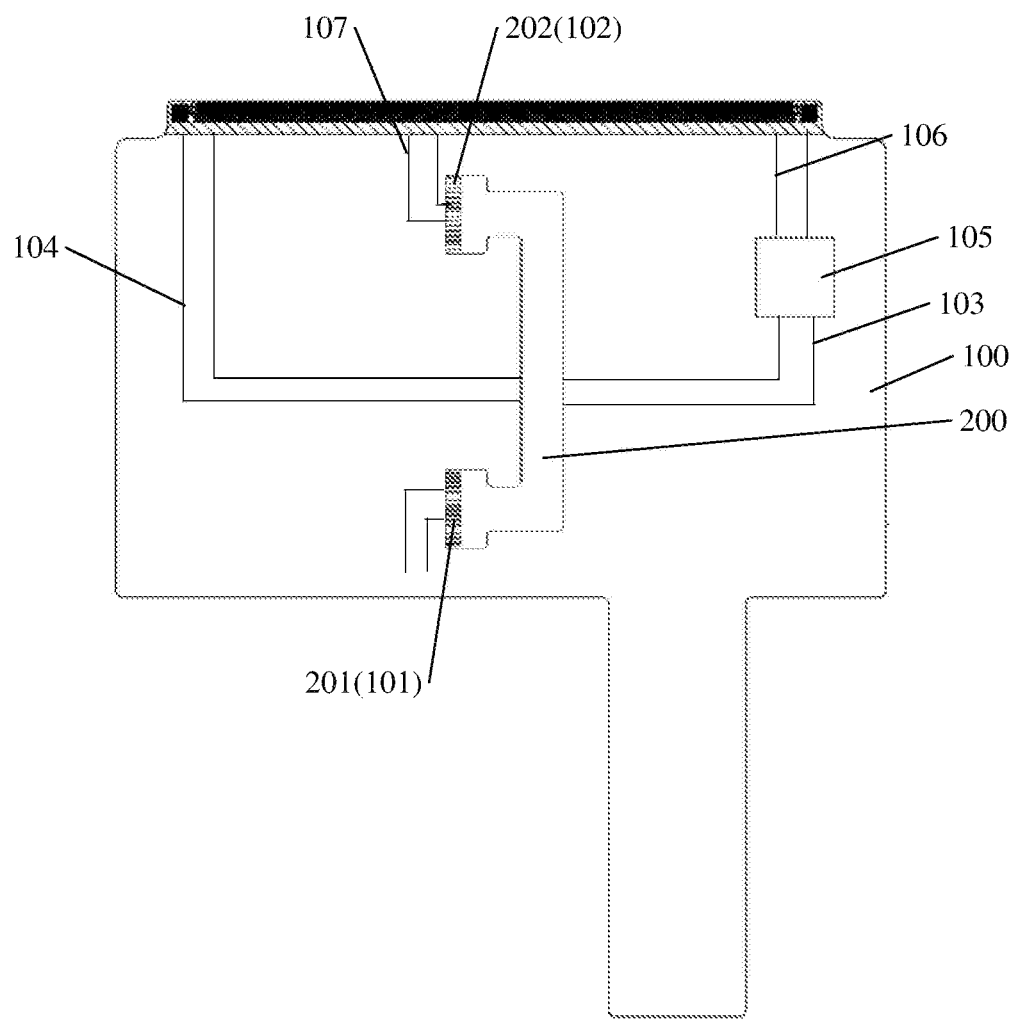
FIG. 1D is a schematic plan view of a flexible circuit board provided by at least one embodiment of the present disclosure.

In addition, the embodiments of the present disclosure do not specifically limit the setting mode of the bridge sub-circuit board 200. For example, in the above embodiment, the bridge sub-circuit board 200 is horizontally arranged to bridge wirings at left and right sides of the main body sub-circuit board 100, and the wiring in the middle of the main body sub-circuit board 100 passes under the bridge sub-circuit board 200. In other embodiments, as shown in FIG. 1D, the arrangement direction of the bridge sub-circuit board 200 may also be provided for vertical bridging, so that wirings at upper and lower sides of the main body sub-circuit board 100 are bridged, while the wirings at the left and right sides of the main body sub-circuit board 100 pass under the bridge sub-circuit board 200.

Figure 5A:
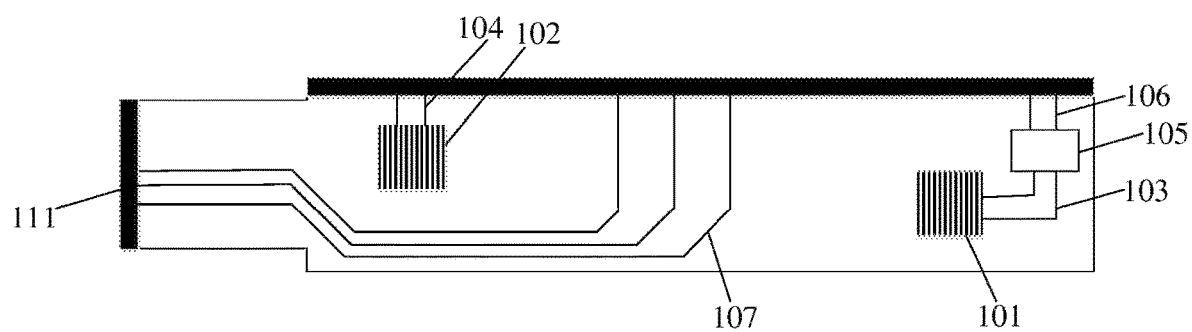
FIG. 5A is a schematic plan view of a main body sub-circuit board of a flexible circuit board provided by at least one embodiment of the present disclosure.

For example, FIG. 5A shows a schematic plan view of another main body sub-circuit board provided by an embodiment of the present disclosure. This main body sub-circuit board adopts a different shape and circuit arrangement from the above embodiments.

For example, as shown in FIG. 5, the main body sub-circuit board is in an elongated shape. The first bridge connection end 101, the second bridge connection end 102, the first wiring portion 103, the second wiring portion 104, the second functional wiring 106 and other structures of the main body sub-circuit board have similar arrangements as those of the main body sub-circuit board of the above embodiments. However, compared with the main body sub-circuit board of the above embodiments, in the main body sub-circuit board shown in FIG. 5, the third wiring portion 107 extends from the middle of the main body sub-circuit board and turns to the left side of the main body sub-circuit board at a side (the lower side shown in the figure) of the main body sub-circuit board, and is electrically connected to a terminal 111 at the left side of the main body sub-circuit board. The terminal 111 is provided with a plurality of contact pads thereon, and a plurality of wirings in the third wiring portion 107 correspond to and are electrically connected to a plurality of contact pads on the terminal 111 one by one. For example, the terminal 111 may be electrically connected with other display devices or control chips, which is not limited by the embodiments of the present disclosure.

For example, in some embodiments, the main body sub-circuit board may be a single-layer wiring structure or a multi-layer wiring structure (such as a double-layer wiring structure or a three-layer wiring structure, or the like), which is not limited by the embodiments of the present disclosure.

In some embodiments, an outline shape of the bridge sub-circuit board 200 is an asymmetric structure. The second bridge connection end 102 and the first wiring portion 103 as shown in FIG. 5A are asymmetric.

Figure 6A:
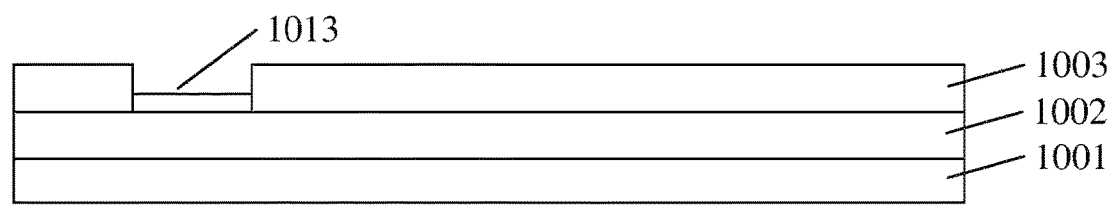
FIG. 6A is a schematic cross-sectional view of a main body sub-circuit board of a flexible circuit board provided by at least one embodiment of the present disclosure.

For example, FIG. 6A shows a schematic cross-sectional view of a main body sub-circuit board provided by some embodiments of the present disclosure, which is taken along the line A-A in FIG. 2. In these embodiments, the main body sub-circuit board 100 has a single-layer wiring structure. As shown in FIG. 6A, the main body sub-circuit board 100 includes a first substrate 1001, as well as a first main body wiring layer 1002 and a first main body insulating layer 1003 laminated on a side of the first substrate 1001. The first main body wiring layer 1002 includes a first wiring portion 103, a second wiring portion 104, a first bridge connection end 101 and a second bridge connection end 102 and other structures. The first bridge connection end 101 and the second bridge connection end 102 are exposed by the first main body insulating layer 1003. For example, the first main body insulating layer 1003 serves as a protective layer to provide structural and electrical protection for the first main body wiring layer 1002. For example, the first main body insulating layer 1003 may be combined with the first main body wiring layer 1002 and the first substrate 1001 through an adhesive layer (not shown in the figure). For example, an opening 1013 is formed in the first main body insulating layer 1003. In the opening 1013, for example, a portion of the exposed first wiring layer 1002 corresponding to the first bridge connection end 101 or the second bridge connection end 102 may be subjected to surface treatment (for example, plated with a solder layer), to form a plurality of patterned contact pads and correspondingly form the first bridge connection end 101 or the second bridge connection end 102.

For example, when the main body sub-circuit board further includes the second functional wiring 106 and the third functional wiring 107, the second functional wiring 106 and the third functional wiring 107 are also arranged in the first wiring layer 1002. At this time, the main body sub-circuit board has a single-layer wiring structure with a single-layer wiring layer.

Figure 6B:
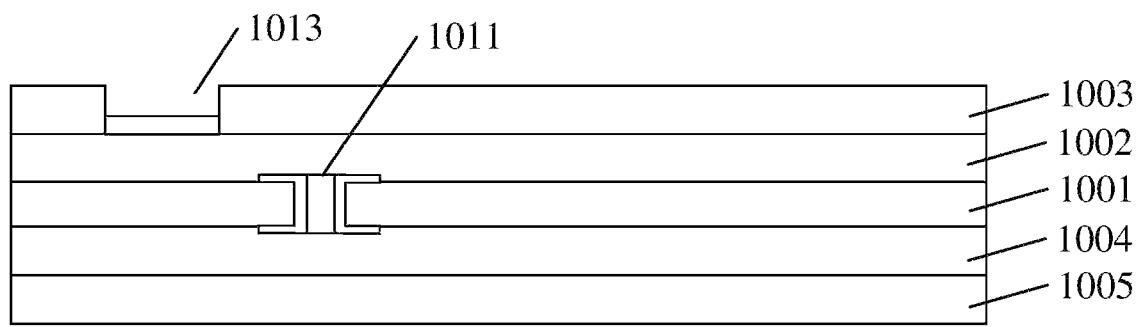
FIG. 6B is a schematic cross-sectional view of a main body sub-circuit board of a flexible circuit board provided by at least one embodiment of the present disclosure.

For example, FIG. 6B shows a schematic cross-sectional view of another main body sub-circuit board provided by some embodiments of the present disclosure, which is taken along the line A-A in FIG. 2, for example. In these embodiments, the main body sub-circuit board 100 has a multi-layer wiring structure. The description will be made by taking an example of the main body sub-circuit board 100 with a double-layer wiring structure with reference to FIG. 6B, however, the embodiments of the present disclosure are not limited thereto.

As shown in FIG. 6B, in this example, the main body sub-circuit board 100 includes a first substrate 1001, as well as a first main body wiring layer 1002 and a first main body insulating layer 1003 which are located and laminated on the first side (shown as the upper side in the figure) of the first substrate 1001; and also includes a second main body wiring layer 1004 and a second main body insulating layer 1005 which are located and laminated on the second side (shown as the lower side in the figure) of the first substrate 1001. The first main body insulating layer 1003 serves as a protective layer to provide structural and electrical protection for the first main body wiring layer 1002. For example, the first main body insulating layer 1003 may be combined with the first main body wiring layer 1002 and the first substrate 1001 through an adhesive layer (not shown). The second insulating layer 1005 serves as a protective layer to provide structural and electrical protection for the second main body wiring layer 1004. For example, the second main body insulating layer 1005 may be combined with the second main body wiring layer 1004 and the first substrate 1001 through an adhesive layer (not shown).

For example, in some examples, the first main body wiring layer 1002 includes a first wiring portion 103 and a second wiring portion 104. At this time, the first wiring portion 103 and the second wiring portion 104 may be arranged to be intersected in the first main body wiring layer 1002 and the second main body wiring layer 1004. For example, two adjacent ones of the wirings of the first wiring portion 103 on the board surface of the main body sub-circuit board 100 may be located in the first main body wiring layer 1002 and the second main body wiring layer 1004, respectively, thereby facilitating the arrangement of wirings. For example, the second wiring portion 104 may be similarly arranged.

For example, when the main body sub-circuit board further includes a second functional wiring 106 and a third functional wiring 107, which may also be intersected in first main body wiring layer 1002 and second main body wiring layer 1004. Alternatively, the first main body wiring layer 1002 may include a first wiring portion 103 and a second wiring portion 104; and the second main body wiring layer 1004 may include a second functional wiring 106 and a third functional wiring 107, that is, different wiring layers may be arranged with different functional wirings. The embodiments of the present disclosure do not specifically limit the wiring layout on the main body sub-circuit board 100.

Figure 5B:
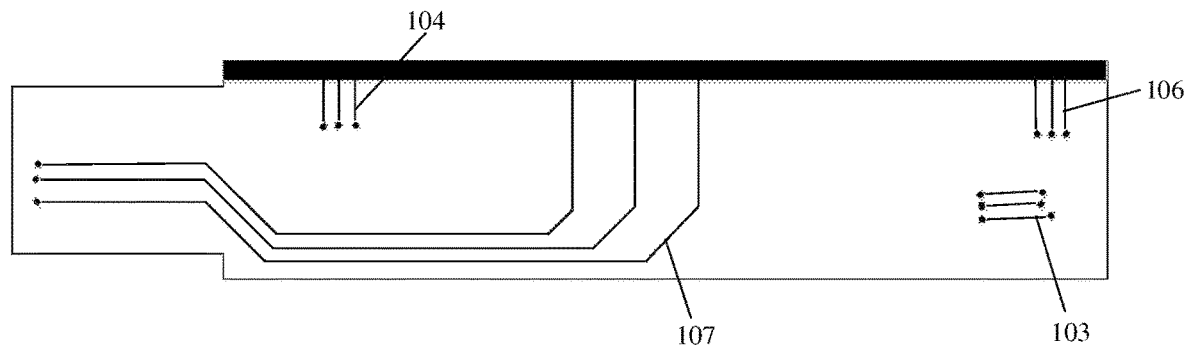
FIG. 5B is a schematic plan view of a main body sub-circuit board of a flexible circuit board provided by at least one embodiment of the present disclosure.

For example, in the embodiment shown in FIG. 5A, when the first wiring portion 103, the second wiring portion 104, the second functional wiring 106 and third functional wiring 107 on the main body sub-circuit board 100 are alternately arranged in first main body wiring layer 1002 and the second main body wiring layer 1004, the first main body wiring layer 1002 is schematically shown in FIG. 5A, and the second main body wiring layer 1004 is schematically shown in FIG. 5B. At this time, the wirings in the second main body wiring layer 1004 have a similar arrangement as the wirings in the first main body wiring layer 1002, and the wirings in the second main body wiring layer 1004 may be electrically connected to the first main body wiring layer 1002 through via holes (for example, black dots shown in FIG. 5B) and exposed by a corresponding insulating layer to form bridge ends.

For example, in some embodiments, as shown in FIG. 6B, the first bridge connection end 101 and the second bridge connection end 102 may be exposed by the first main body insulating layer 1003. For example, similarly, an opening 1013 is formed in the first main body insulating layer 1003, for example, a portion of the exposed first main body wiring layer 1002 corresponding to the first bridge connection end 101 or the second bridge connection end 102 may be subjected to surface treatment in the opening 1013, so as to form a plurality of patterned contact pads and correspondingly form the first bridge connection end 101 or the second bridge connection end 102. Similarly, the wirings located in the second main body wiring layer 1004 pass through the via hole 1011 in the first substrate 1001, the first main body wiring layer 1002 and the opening 1013 of the first main body insulating layer 1003 to form the bridge ends. For example, the via hole 1011 in the first substrate 1001 and the opening 1013 of the first main body insulating layer 1003 are arranged in a staggered manner, so that the position of the opening 1013 is relatively planar in the manufacturing process, and it is easy to form a contact pad.

For example, in some embodiments, the first bridge connection end 101 and the second bridge connection end 102 may be exposed at different sides of the main body sub-circuit board, respectively, so that the first bridge connection end 101 and the second bridge connection end 102 are disposed at different the sides of the main body sub-circuit board.

Figure 7A:
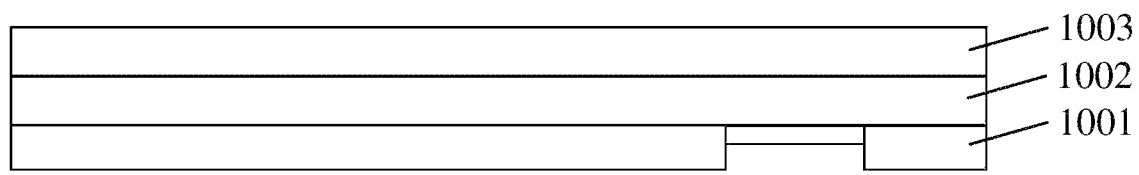
FIG. 7A is another schematic cross-sectional view of a main body sub-circuit board of a flexible circuit board provided by at least one embodiment of the present disclosure.

For example, FIG. 7A shows a schematic cross-sectional view of a main body sub-circuit board provided by some embodiments of the present disclosure, which is taken along the line C-C in FIG. 2, for example. In this embodiment, the main body sub-circuit board has a single-layer wiring structure. The first bridge connection end 101 of the main body sub-circuit board is exposed by the first main body insulating layer 1003 as shown in FIG. 6A. The second bridge connection end 102 is exposed by the first substrate 1001, so that the first bridge connection end 101 and the second bridge connection end 102 are arranged at different sides of the main body sub-circuit board.

Figure 7B:
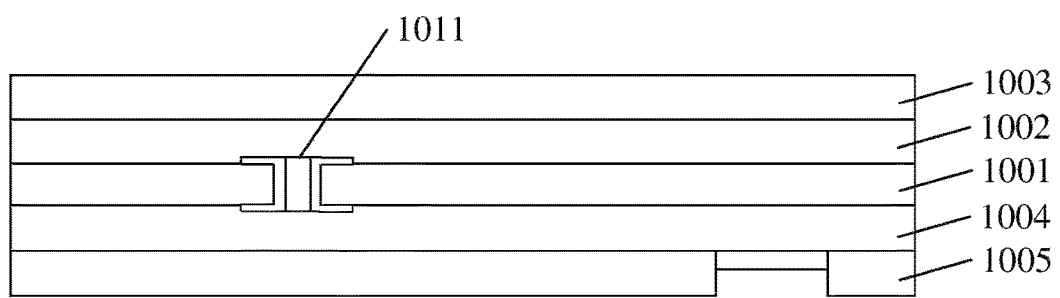
FIG. 7B is another schematic cross-sectional view of a main body sub-circuit board of a flexible circuit board provided by at least one embodiment of the present disclosure.

For example, FIG. 7B shows a schematic cross-sectional view of another main body sub-circuit board provided by some embodiments of the present disclosure, which is taken along the line C-C in FIG. 2, for example. In this embodiment, the main body sub-circuit board has a double-layer wiring structure. The first bridge connection end 101 of the main body sub-circuit board is exposed by the first main body insulating layer 1003, as shown in FIG. 6B; the second bridge connection end 102 is exposed by the second main body insulating layer 1005, so that the first bridge connection end 101 and the second bridge connection end 102 are arranged at different sides of the main body sub-circuit board.

For example, in some embodiments, the main body sub-circuit board may also have a multi-layer wiring structure, for example a three-layer wiring structure and a four-layer wiring structure. At this time, the wirings on the main body sub-circuit board, such as wirings of the first wiring portion, the second wiring portion, the second functional wiring, and the third functional wiring, may be arranged in a plurality of wiring layers. For example, the first wiring portion, the second wiring portion, the second functional wiring, and the third functional wiring are alternately arranged in a plurality of wiring layers, or are respectively arranged in different wiring layers. Embodiments of the present disclosure do not specifically limit the number of wiring layers and wiring arrangement of the main body sub-circuit board.

Figure 8A:
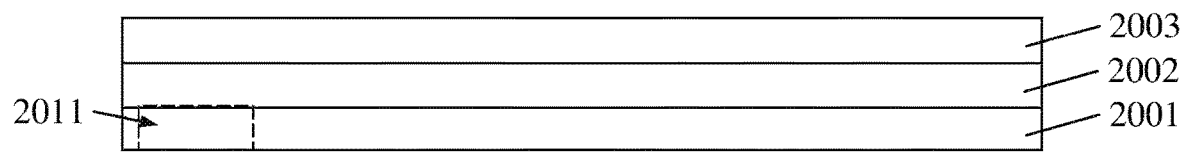
FIG. 8A is a schematic cross-sectional view of a bridge sub-circuit board of a flexible circuit board provided by at least one embodiment of the present disclosure.

Similarly, the bridge sub-circuit board may also have a single-layer wiring structure or a multi-layer wiring structure. For example, FIG. 8A shows a schematic cross-sectional view of a bridge sub-circuit board provided by some embodiments of the present disclosure, which is taken along the line B-B in FIG. 3A, for example. In these embodiments, the bridge sub-circuit board 200 has a single-layer wiring structure.

For example, as shown in FIG. 8A, the bridge sub-circuit board 200 includes a second substrate 2001, as well as a first bridge wiring layer 2002 and a first bridge insulating layer 2003 located at a first side (shown as the upper side in the figure) of the second substrate 2001, and the first bridge wiring layer 2002 includes a third wiring portion 203. Similarly, the first bridge insulating layer 2003 serves as a protective layer to provide structural and electrical protection for the first bridge wiring layer 2002. For example, the first bridge insulating layer 2003 may be combined with the first bridge wiring layer 2002 and the second substrate 2001 through an adhesive layer (not shown).

For example, the second substrate 2001 has an opening 2011, for example, a portion of the exposed first bridge wiring layer 2002 corresponding to the third bridge connection end 201 or the fourth bridge connection end 202 may be subjected to surface treatment in the opening 2011, to form a plurality of patterned contact pads and correspondingly form the third bridge connection end 201 or the fourth bridge connection end 202.

Figure 8B:
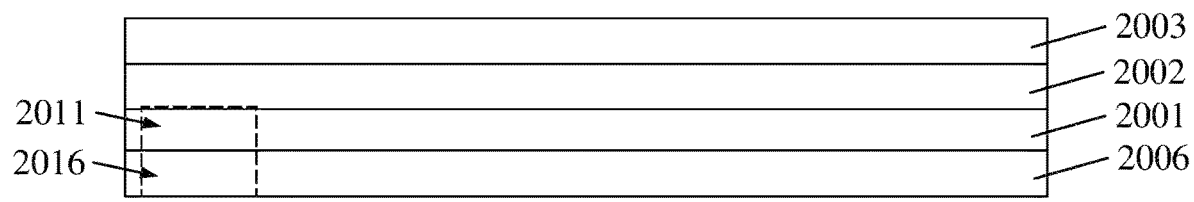
FIG. 8B is a schematic cross-sectional view of a bridge sub-circuit board of a flexible circuit board provided by at least one embodiment of the present disclosure.

For example, in some embodiments, as shown in FIG. 8B, the bridge sub-circuit board 200 may further include a shielding layer 2006 which is disposed at a side of the second substrate 2001 far away from the first bridge wiring layer 2002. For example, the shielding layer 2006 may be grounded, so as to achieve an effect of electromagnetic shielding, and prevent the wirings in the main body sub-circuit board and the bridge sub-circuit board from occurring signal crosstalk. For example, the shielding layer 2006 has a hollowed-out structure 2016, which corresponds to the opening 2011 in the second substrate 2001 to expose the third bridge connection end 201 or the fourth bridge connection end 202.

Figure 8C:
FIG. 8C is a schematic cross-sectional view of a bridge sub-circuit board of a flexible circuit board provided by at least one embodiment of the present disclosure.

For example, FIG. 8C shows a schematic cross-sectional view of another bridge sub-circuit board provided by some embodiments of the present disclosure, which is taken along the line B-B in FIG. 3A, for example. In these embodiments, the bridge sub-circuit boards 200 has a multi-layer structure. A bridge sub-circuit boards 200 with a double-layer structure will be taken as an example with reference to FIG. 8C and described below, however, the embodiments of the present disclosure are not limited thereto.

As shown in FIG. 8C, the bridge sub-circuit board 200 includes a second substrate 2001, as well as a first bridge wiring layer 2002 and a first bridge insulating layer 2003 located at a first side (shown as the upper side in the figure) of the second substrate 2001, the first bridge wiring layer 2002 includes a third wiring portion 203. Similarly, the first bridge insulating layer 2003 serves as a protective layer to provide structural and electrical protection for the first bridge wiring layer 2002. For example, the first bridge insulating layer 2003 may be combined with the first bridge wiring layer 2002 and the second substrate 2001 through an adhesive layer (not shown).

For example, as shown in FIG. 8C, the bridge sub-circuit board 200 may further include a second bridge wiring layer 2004 located at a second side (shown as the lower side in the figure) opposite to the first side of the second substrate 2001 and a second bridge insulating layer 2005 laminated on the second bridge wiring layer 2004. For example, the second bridge wiring layer 2004 may also include a third wiring portions 203. At this time, the third wiring portions 203 may be alternately arranged in the first bridge wiring layer 2002 and the second bridge wiring layer 2004. For example, two adjacent ones of the wirings of the third wiring portion 203 on the board surface of the bridge sub-circuit board 200 may be located in the first bridge wiring layer 2002 and the second bridge wiring layer 2004, respectively, thereby facilitating wiring arrangement. For example, it is shown as the dashed lines in FIG. 8D that the wiring portions at both sides of the second bridge wiring layer 2004 are not electrically connected.

For example, the third wiring portion 203 at the first side of the bridge sub-circuit board 200 is exposed and led out through the via hole 2011 in the second substrate 2001 and the opening 2015 in the second bridge insulating layer 2005, for example, a plurality of patterned contact pads are formed by surface treatment to form a third bridge connection end 201 or a fourth bridge connection end 202. For example, the opening 2015 in the second bridge insulating layer 2005 is formed at a position as shown by the dashed box shown in FIG. 8C or at other suitable positions, and the embodiment of the present disclosure does not limit thereto.

Figure 8D:
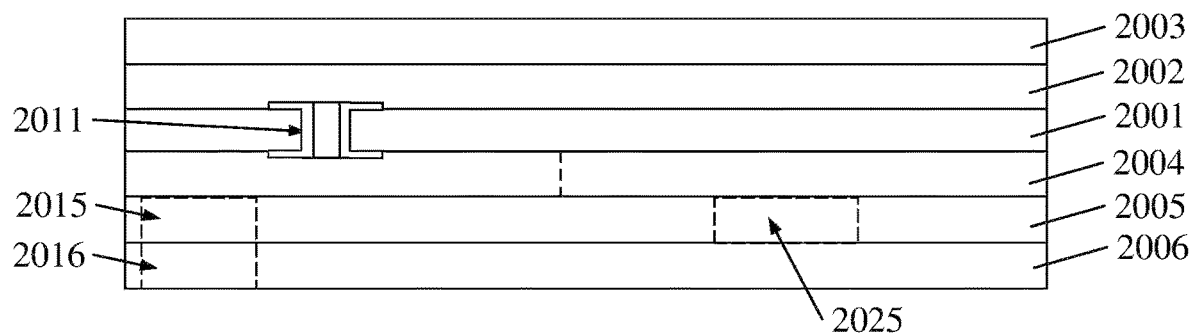
FIG. 8D is a schematic cross-sectional view of a bridge sub-circuit board of a flexible circuit board provided by at least one embodiment of the present disclosure.

For example, as shown in FIG. 8D, in some embodiments, the bridge sub-circuit board 200 may further include a shielding layer 2006 at a second side of the second substrate 2001. The shielding layer 2006, for example, is disposed at a side of the second bridge insulating layer 2005 far away from the second substrate 2001. For example, the shielding layer 2006 is grounded to achieve an effect of electromagnetic shielding. For example, the shielding layer 2006 has a hollowed-out structure 2016 at a position corresponding to the opening 2015 of the second bridge insulating layer 2005, to form the exposed third bridge connection end 201 or the fourth bridge connection end 202.

For example, when the bridge sub-circuit board 200 is installed on the main body sub-circuit board 100, the second side is closer to the main body sub-circuit board 100 than the first side. Therefore, the shielding layer 2006 is located between wiring layers of the main body sub-circuit board 100 and the bridge sub-circuit board 200, to prevent the signal crosstalk between the wiring layers of the main body sub-circuit board 100 and the bridge sub-circuit board 200.

For example, in some embodiments, the second bridge wiring layer 2004 may be a ground layer including a plurality of ground wirings. At this time, the third wiring portion 203 may entirely be disposed in the first bridge wiring layer 2002. Therefore, a ground layer is further provided between the wiring layers of the main body sub-circuit board 100 and the bridge sub-circuit board 200, to further prevent the signal crosstalk between the wiring layers of main body sub-circuit board 100 and bridge sub-circuit board 200. Alternatively, in some embodiments, the third wiring portion 203 may has a part disposed in the first bridge wiring layer 2002 and another part disposed in the second bridge wiring layer 2004. At this time, the ground wirings in the second bridge wiring layer 2004 and some of the wirings of the third wiring portion 203 may be alternately arranged. Therefore, the second bridge wiring layer 2004 can also play a role in preventing the signal crosstalk.

When the bridge sub-circuit board has both the ground layer and the shielding layer 2006, the ground layer 2004 and the shielding layer 2006 can achieve the double shielding effect, thus prevent the signal crosstalk between the wirings on the main body sub-circuit board 100 and the wirings on the bridge sub-circuit board 200.

For example, in some embodiments, the bridge sub-circuit board 200 may further include an insulating layer (not shown) outside the shielding layer 2006 (i.e., a side far away from the second substrate 2001) to provide protection for the shielding layer 2006, and the insulating layer may be combined with the shielding layer 2006 by an adhesive layer, for example. The insulating layer may also include openings corresponding to the openings 2015 and the hollowed-out structures 2016 to expose the bridge ends. For example, the via hole 2011 in the second substrate 2001 and the opening 2015 of the second bridge insulating layer 2005 are arranged in a staggered manner, so that the position of the opening 1015 is relatively planar in the manufacturing process, and it is easy to form a contact pad.

For example, in some embodiments, the third bridge connection end 201 or the fourth bridge connection end 202 of the bridge sub-circuit board 200 may be respectively exposed at different sides of the bridge sub-circuit board 200, so that the third bridge connection end 201 and the fourth bridge connection end 202 are disposed at different sides of the bridge sub-circuit board 200.

Figure 9A:
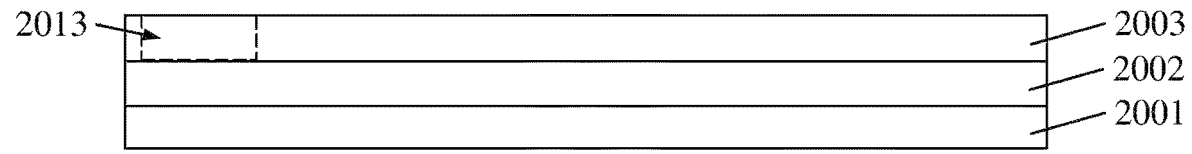
FIG. 9A is another schematic cross-sectional view of a bridge sub-circuit board of a flexible circuit board provided by at least one embodiment of the present disclosure.

For example, FIG. 9A shows a schematic cross-sectional view of another bridge sub-circuit board provided by some embodiments of the present disclosure, which is taken along the line D-D in FIG. 3A, for example. In this embodiment, the bridge sub-circuit board has a single-layer wiring structure. For example, the third bridge connection end 201 of the bridge sub-circuit board is exposed by the second substrate 2001, as shown in FIG. 8A; the fourth bridge connection end 202 is exposed by an opening 2013 in the first bridge insulating layer 2003, as shown in FIG. 9A, so that the third bridge connection end 201 and the fourth bridge connection end 202 are arranged at different sides of the bridge sub-circuit board.

Figure 9B:
FIG. 9B is another schematic cross-sectional view of a bridge sub-circuit board of a flexible circuit board provided by at least one embodiment of the present disclosure.

For example, FIG. 9B shows a schematic cross-sectional view of another bridge sub-circuit board provided by some embodiments of the present disclosure, which is taken along the line D-D in FIG. 3A, for example. In this embodiment, the bridge sub-circuit board has a double-layer wiring structure. For example, the third bridge connection end 201 of the bridge sub-circuit board is exposed by the second bridge insulating layer 2005, as shown in FIG. 8C; the fourth bridge connection end 202 is exposed by the opening 2013 in the first bridge insulating layer 2003, as shown in FIG. 9B, so that the third bridge connection end 201 and the fourth bridge connection end 202 are disposed at different sides of the bridge sub-circuit board.

For example, in some embodiments, the bridge sub-circuit board may also have a multi-layer wiring structure, for example a three-layer wiring structure and a four-layer wiring structure. At this time, the third wiring portion on the bridge sub-circuit board may be arranged in a plurality of wiring layers. For example, the third wiring portion may be alternately arranged in a plurality of wiring layers. Embodiments of the present disclosure do not specifically limit the number of wiring layers and the arrangement of wirings of the bridge sub-circuit board.

For example, in some embodiments, when the first bridge connection end 101 and the second bridge connection end 102 of the main body sub-circuit board are arranged at different sides of the main body sub-circuit board, and the third bridge connection end 201 and the fourth bridge connection end 202 of the bridge sub-circuit board are also respectively arranged at different sides of the bridge sub-circuit board, the third bridge connection end 201 and the fourth bridge connection end 202 of the bridge sub-circuit board may be electrically connected to the first bridge connection end 101 and the second bridge connection end 102 at different sides of the main body sub-circuit board, respectively. Alternatively, when the first bridge connection end 101 and the second bridge connection end 102 of the main body sub-circuit board are arranged at different sides of the main body sub-circuit board, and the third bridge connection end 201 and the fourth bridge connection end 202 of the bridge sub-circuit board are arranged at the same side of the bridge sub-circuit board, the third bridge connection end 201 and the fourth bridge connection end 202 of the bridge sub-circuit board may be folded to be electrically connected to the first bridge connection end 101 and the second bridge connection end 102 at different sides of the main body sub-circuit board, so that the bridge sub-circuit board may be bridged on the main body sub-circuit board in a form similar to "hair clip".

For example, the first substrate 1001 and the second substrate 2001 may be made of flexible materials such as polyimide or polyester; the wiring layers may be made of metal materials such as copper, silver and aluminum or alloy materials; the insulating layers may be made of insulating materials such as polyimide or polyester; and the ground layer 2004 may be made of a metal material such as copper layer or copper foil. The shielding layer 2006 includes an insulating substrate and a conductive material filled in the insulating substrate, for example, the insulating substrate is epoxy resin, and the filled conductive material is copper powder, graphite powder, or the like. Alternatively, in some embodiments, the shielding layer 2006 may also be made of a metal material. The materials of functional layers are not specifically limited in this disclosure. The adhesive layer adopts epoxy resin, polyethylene, or the like.

For example, the third bridge connection end 201 and the fourth bridge connection end 202 of the bridge sub-circuit board 200 are connected to the first bridge connection end 101 and the second bridge connection end 102 of the main body sub-circuit board 100 through anisotropic conductive adhesive, soldering material or connectors, respectively. For example, the connector includes a zero insertion force (ZIF) connector, a board to board (BTB) connector, or the like. The embodiments of the present disclosure do not specifically limit the connection mode of bridge ends.

As an example, a BTB connector is used to connect the main body sub-circuit board 100 and the bridge sub-circuit board 200. At this time, the connector includes a male connector and a female connector cooperated with each other. For example, the first bridge connection end 101 and the second bridge connection end 102 of the main body sub-circuit board 100 are provided with female connectors, the third bridge connection end 201 and the fourth bridge connection end 202 of the bridge sub-circuit board 200 are provided with male connectors, so that the bridge sub-circuit board 200 is connected to the main body sub-circuit board 100 through plug-in of male connectors and female connectors.

The flexible circuit board provided by the embodiment of the present disclosure has a main body sub-circuit board and a bridge sub-circuit board, and the wirings at both sides of the main body sub-circuit board may be bridged by the bridge sub-circuit board, to avoid the intersection of the wirings on the main body sub-circuit board, prevent or weaken the signal crosstalk, or avoid adding additional functional layers for preventing signal crosstalk, and thus avoid the complexity of the circuit board structure. In some embodiments of the present disclosure, the main body sub-circuit board and the bridge sub-circuit board have a simple single-layer structure or a double-layer structure, so as to make the wiring layout simpler, and reduce the manufacturing difficulty of the main body sub-circuit board and the bridge sub-circuit board.

Figure 10A:
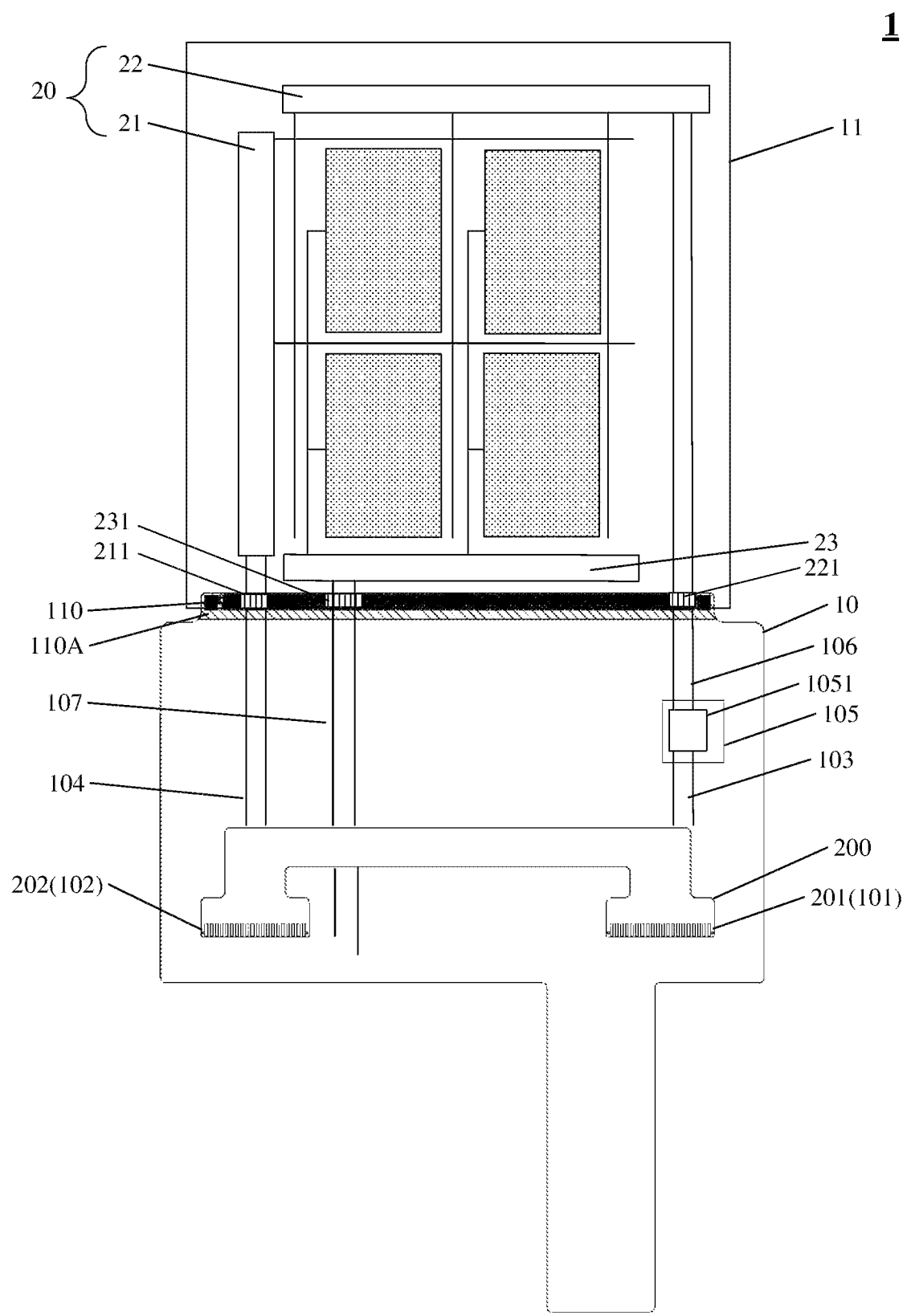
FIG. 10A is a schematic view of an electronic device module provided by at least one embodiment of the present disclosure.

Some embodiments of the present disclosure provide an electronic device module, and FIG. 10A shows a schematic view of the electronic device module. As shown in FIG. 10A, the electronic device module 1 includes an electronic device substrate 11 and any one of the flexible circuit boards 10 described above. The electronic device substrate 11 includes a first functional circuit structure 20. The first functional wiring that includes the first wiring portion 103, the second wiring portion 104 and the third wiring portion 203 of the flexible circuit board 10 is electrically connected to the first functional circuit structure 20.

For example, in some embodiments, the flexible circuit board 10 further includes a second functional wiring 106, and the first functional circuit structure 20 includes a first signal transmission portion 21 and a second signal transmission portion 22.

For example, in some embodiments, the electronic device substrate 11 further includes a second functional circuit structure 23, the flexible circuit board further includes a third functional wiring 107 electrically connected to the second functional circuit structure 23.

For example, in some embodiments, the electronic device substrate 11 is a substrate with a display function and a touch function. At this time, the first functional circuit structure 20 is a touch circuit structure, and the second functional circuit structure 23 is a display circuit structure. In other embodiments, the electronic device substrate 11 is a substrate with a display function and a fingerprint recognition function. In this case, the first functional circuit structure 20 is a fingerprint recognition circuit structure, for example, a capacitive fingerprint recognition circuit, which includes a detection driving electrode and a detection sensing electrode that are arranged crosswise. The second functional circuit structure 23 is a display circuit structure. The first functional circuit structure 20 with a touch circuit structure will be taken as an example and described below.

For example, the arrangement of the touch circuit structure on the electronic device substrate 11 may be in a built-in manner or in a built-out manner. The touch circuit structure may be in a capacitive form, such as a mutual capacitive touch circuit structure. For example, the mutual capacitive touch circuit structure includes a plurality of first electrodes extending in a first direction and a plurality of second electrodes extending in a second direction intersecting the first direction, and a detection capacitor is formed at a position where two groups of electrodes intersect, that is, these two groups of electrodes respectively form two poles of the capacitor. When the touch circuit structure is touched by a finger, the finger will affect the coupling state between two electrodes close to the touch point, so as to change the capacitance of the detection capacitor between these two electrodes. According to the capacitance variation data of the touch circuit structure and coordinates of capacitances, the coordinates of each touch point can be obtained. When a size of the capacitance is detected, transverse electrodes are used as touch driving circuits to send sequentially excitation signals, and longitudinal electrodes are used as touch sensing circuits to receive signals simultaneously or sequentially, so that capacitance values of intersection points of all transverse and longitudinal electrodes can be obtained, that is, a capacitance value of a two-dimensional plane of the whole touch structure can be obtained. Therefore, even if there are several touch points on the touch structure, a real coordinate of each touch point can be determined.

For example, in the situation as mentioned above, the first signal transmission portion 21 may include a touch driving wiring electrically connected to a touch driving (Tx) circuit of the touch circuit, and the second signal transmission portion 22 may include a touch sensing wiring electrically connected to a touch sensing (Rx) circuit of the touch circuit. At this time, the first control circuit 1051 is a touch driving IC, and may provide excitation signals for the touch driving circuit through the touch driving wiring, receive induction signals from the touch sensing circuit through the touch sensing wiring, judge a touch position based on the above signals and make a response. For example, in the above example, the touch driving circuit is bridged and the touch sensing circuit is directly electrically connected to the first control circuit combination structure 105, so that the touch sensing circuit is closer to the first control circuit combination structure 105, that is, closer to the first control circuit 1051 installed thereon (i.e., the touch driving IC), so that a path for transmitting the sensing signal received by the touch sensing circuit to the touch driving IC is short, and the possibility that the sensing signal is interfered by signals is small, thereby ensuring the touch operation more accurate. For example, as shown in the figure, the touch driving wiring and the touch sensing wiring extend to the same side (the lower side in the figure) of the electronic device substrate 11, and are electrically connected to the contact pads 211 and 221 formed on this side, respectively.

For example, in other embodiments of the present disclosure, the first signal transmission portion 21 may include a touch sensing wiring electrically connected to a touch sensing (Rx) circuit of the touch circuit, and the second signal transmission portion 22 may include a touch driving wiring electrically connected to a touch driving (Tx) circuit of the touch circuit. At this time, the touch sensing circuit is bridged, and the touch driving circuit is directly electrically connected to the first control circuit combination structure 105, so that the touch driving circuit is closer to the first control circuit combination structure 105, that is, closer to the first control circuit 1051 installed thereon, (i.e., the touch driving IC), so that in this embodiment, the touch driving signal in the touch driving circuit is less likely to be interfered by signals.

For example, the flexible circuit board 10 has a terminal 110 at a side thereof (e.g., the upper side in the figure), and the terminal 110 has a plurality of contact pads thereon. Another ends of a plurality of wirings of the second wiring portion 104 are electrically connected to some of the contact pads in the terminal 110 in one-to-one correspondence; another ends of a plurality of wirings of the second functional wiring 106 are electrically connected to some other of the contact pads in the terminal 110 in one-to-one correspondence, and another ends of a plurality of wirings of the third functional wiring 107 are electrically connected to some further of the contact pads in the terminal 110 in one-to-one correspondence. For example, some contact pads respectively electrically connected to the second wiring portion 104, the third functional wiring 107; and the second functional wiring 106 are arranged at intervals or continuously at the terminal 110, which is not specifically limited by the embodiments of the present disclosure. For example, when there are many wirings in the second wiring portion 104, the third functional wiring 107, and the second functional wiring 106, the contact pads connected thereto may be continuously arranged at the terminal 110. When there are few wirings in the second wiring portion 104, the third functional wiring 107, and the second functional wiring 106, the contact pads connected thereto may be arranged at intervals at the terminal 110. At this time, for example, a plurality of groups of contact pads spaced apart as shown in FIG. 10A may be formed.

For example, the terminal 110 is arranged in the wiring area 110A of the main body sub-circuit board (i.e., the diagonal line area below the terminal 110 in the figure). For example, the wiring area 110A only has a wiring layer and a part of an insulation layer, but does not have a shielding layer or other structures, so the wiring area 110A has a great transparency. In the process of bonding the flexible circuit board 10 to the electronic device substrate 11, a clear alignment can be realized so as to facilitate accurate electrical connection between the flexible circuit board 10 and the electronic device substrate 11.

For example, when the flexible circuit board 10 is combined with the electronic device substrate 11, contact pads of the terminal 110 at the side of the flexible circuit board 10 and contact pads at the side of the electronic device substrate 11 may be directly pressure-molded together. For example, in some embodiments, contact pads of the terminal 110 at the side of the flexible circuit board 10 and contact pads at the side of the electronic device substrate 11 are electrically connected to each other through, for example, ACF, so that the first functional wiring on the flexible circuit board 10 is electrically connected with the touch driving wiring connected to the first signal transmission portion 21 through the contact pads 211, and the second functional wiring on the flexible circuit board is electrically connected with the touch sensing wiring connected to the second signal transmission portion 22 through the contact pads 221, such that the first functional wiring and the second functional wiring of the flexible circuit board 10 are electrically connected with the touch circuit structure of the electronic device substrate 11.

For example, the second functional circuit structure 23 (i.e., the display circuit structure) includes a plurality of data lines (and also includes gate lines and the like). A plurality of the data lines are respectively electrically connected to pixel units, and extend to a side (the lower side in the figure) of the electronic device substrate 11 and are electrically connected to the contact pads 231 formed at this side. In the case of an organic light emitting diode (OLED) display substrate, the pixel unit includes a display driving circuit, for example, the display driving circuit includes a plurality of transistors, capacitors, light emitting devices, and the like, and is formed in various forms such as 2T1C, 3T1C or 7T1C. For example, when the flexible circuit board 10 is combined with the electronic device substrate 11, a plurality of contact pads are provided on the terminal 110 of the flexible circuit board 10, the third functional wiring on the flexible circuit board is further electrically connected to the data lines in the second functional circuit structure 23 through the contact pads 231, such that the third functional wiring of the flexible circuit board 10 is electrically connected with the display circuit structure of the electronic device substrate 11.

Figure 10B:
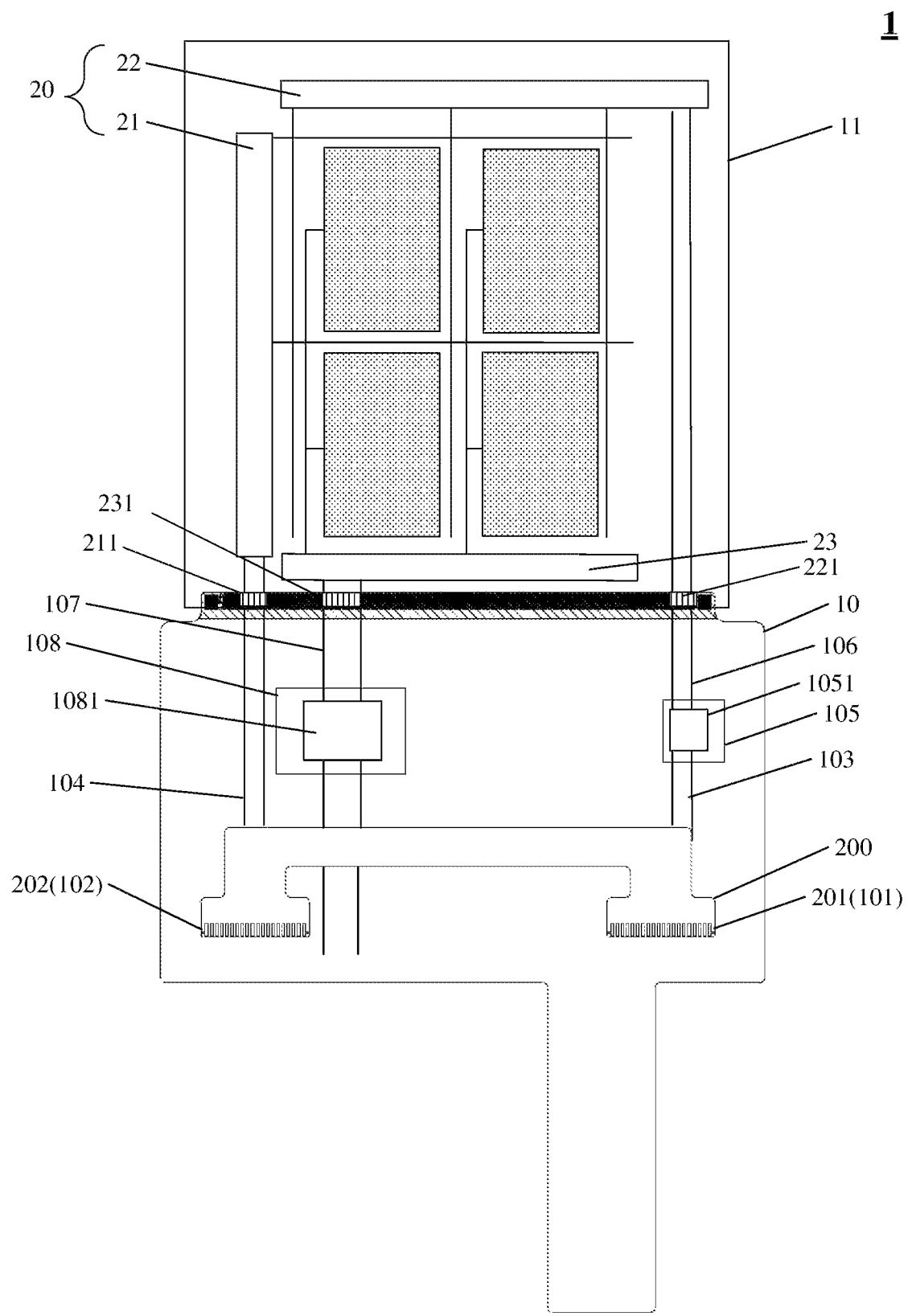
FIG. 10B is a schematic view of another electronic device module provided by at least one embodiment of the present disclosure.

For example, in some embodiments, as shown in FIG. 10B, the main body sub-circuit board 100 may also have a second control circuit combination structure 108 and a second control circuit 1081 disposed on the second control circuit combination structure 108. At this time, the second control circuit 1081 is a display driving IC, which may provide data signals for the display driving circuit, to control the light-emitting state of the light-emitting device through the data signals provided by the display driving IC, so that different display effects can be realized.

As for a liquid crystal display (LCD) substrate, the pixel unit includes a switching element, and a first electrode (a pixel electrode) and a second electrode (a common electrode) for controlling liquid crystal deflection, and the switching element is electrically connected to the first electrode. The second functional circuit structure 23 (i.e., the display circuit structure) includes a plurality of data lines respectively connected to the pixel units. At this time, the second control circuit is a display driving IC, and may provide different data voltage signals to the pixel units through the data lines, to control the torsion state of the liquid crystal, so as to realize different display effects.

For example, the flexible circuit board is combined with the electronic device substrate 11 in a binding manner. When the electronic device substrate 11 is bound, the flexible circuit board may be folded to a back of the electronic device substrate 11 and fixed, that is, installed on a non-display side of the electronic device substrate 11, so as to facilitate the large-screen design of the display screen.

In the flexible circuit board of the electronic device substrate in some embodiments of the present disclosure, the wiring portions located on the main body sub-circuit board and respectively electrically connected to the touch driving circuit are bridged by the bridge sub-circuit board, so that the touch driving circuit does not intersect the display driving circuit on the main body sub-circuit board, and they are shielded from each other at the intersection of the main body sub-circuit board and the bridge sub-circuit board, thereby avoiding the wirings in the main body sub-circuit board and the bridge sub-circuit board from occurring the signal crosstalk; meanwhile, the main body sub-circuit board and the bridge sub-circuit board have simple structure and wiring layout, which is beneficial to simplify the manufacturing process.

Figure 11:
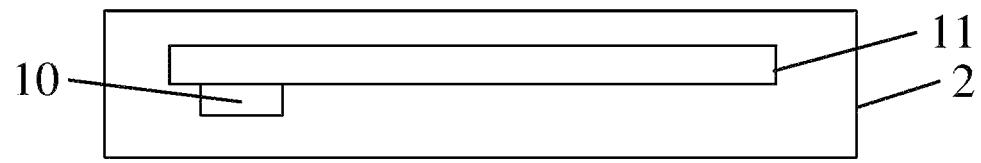
FIG. 11 is a schematic view of a display device provided by some embodiments of the present disclosure.

At least one embodiment of the present disclosure provides a display device, and FIG. 11 shows a schematic view of the display device. As shown in FIG. 11, the display device 2 includes any of the electronic device modules described above, and the electronic device module includes an electronic device substrate 11 and a flexible circuit board 10. For example, the upper side of the electronic device substrate 11 shown in FIG. 11 is a display side and the lower side thereof is a non-display side. At this time, the flexible circuit board 10 is folded and placed at the non-display side of the electronic device substrate 11 after being bound, so as to realize the large-screen design of the display screen.

The display device 2 may be, for example, a mobile phone, a tablet computer, a television, a display, a notebook computer, a digital photo frame, a navigator, and any other products or components with display functions, which are not specifically limited by the embodiments of the present disclosure.

Figure 12:
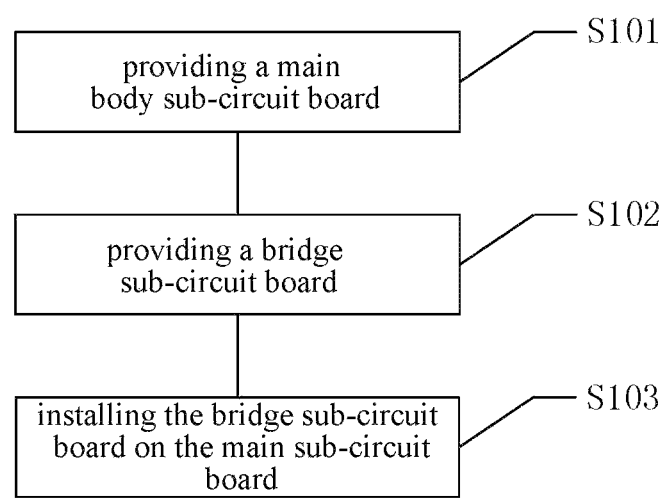
FIG. 12 is a manufacturing flow chart of a flexible circuit board provided by some embodiments of the present disclosure.

Some embodiments of the present disclosure provide a manufacturing method of flexible circuit board, as shown in FIG. 12, which includes steps S101-S103.

S101: providing a main body sub-circuit board.

With reference to FIG. 2, the main body sub-circuit board 100 includes a first bridge connection end 101, a second bridge connection end 102, a first wiring portion 103 and a second wiring portion 104. The first wiring portion 103 and the second wiring portion 104 are spaced apart from each other and electrically connected to the first bridge connection end 101 and the second bridge connection end 102, respectively.

For example, referring to FIG. 6A, the main body sub-circuit board 100 is formed by sequentially forming a first wiring layer 1002 and a first insulating layer 1003 on a first substrate 1001. For example, the first substrate 1001 is made of polyimide or polyester, the first wiring layer 1002 is made of a metal material such as copper, silver and aluminum or an alloy material, and the first insulating layer 1003 is also made of polyimide, polyester, or the like. For example, firstly, a copper metal layer is formed on the first substrate 1001 by sputtering, and then the copper metal layer is patterned to form the first wiring layer 1002. Then, a first insulating layer 1003 is formed on the first wiring layer 1002 by coating, and an opening is formed in the first insulating layer 1003 to form a bridge end.

S102: providing a bridge sub-circuit board.

With reference to FIG. 3, the bridge sub-circuit board 200 includes a third bridge connection end 201, a fourth bridge connection end 202 and a third wiring portion 203; and the third bridge connection end 201 and the fourth bridge connection end 202 are electrically connected by the third wiring portion 203.

For example, referring to FIG. 8A, the bridge sub-circuit board 200 is formed by sequentially forming a first bridge wiring layer 2002 and a first bridge insulating layer 2003 at a first side of a second substrate 2001. For example, the first substrate 2001 is made of a material such as polyimide or polyester, the first bridge wiring layer 2002 is made of a metal material such as copper, silver and aluminum or an alloy material, and the first bridge insulating layer 2003 is also made of a material such as polyimide or polyester. For example, a copper metal layer is formed on the first substrate 2001 by sputtering, and then the copper metal layer is patterned to form the first bridge wiring layer 2002, and then the first bridge insulating layer 2003 is formed on the first bridge wiring layer 2002 by coating.

For example, referring to FIG. 8C, in some embodiments, forming the bridge sub-circuit board 200 further includes sequentially forming a second bridge wiring layer 2004 and a second bridge insulating layer 2005 at a second side of the second substrate 2001 opposite to the first side. For example, the second bridge wiring layer 2004 may be a ground layer made of a material such as copper, and the second bridge insulating layer 2005 is made of a material such as polyimide or polyester. For example, in the second substrate 2001 and the second bridge insulating layer 2005, openings (or via holes) are formed by patterning, a third wiring portion 203 formed at a first side of the bridge sub-circuit board 200 is exposed and led out through a via hole 2011 in the second substrate 2001 and an opening 2015 in the second bridge insulating layer 2005. For example, a plurality of contact pads are formed by surface treatment to form a bridge end.

For example, with continued reference to FIG. 8C, in some embodiments, forming the bridge sub-circuit board 200 further includes forming a shielding layer 2006 at a second side of the second substrate 2001. For example, the shielding layer 2006 is, for example, suspended, or configured to be electrically connected to a ground line.

For example, in some embodiments, as shown in FIG. 8D, when the second bridge wiring layer 2004 is a ground layer, an opening 2025 is also formed in the second bridge insulating layer 2005, and the shielding layer 2006 is electrically connected to the ground wiring in the second bridge wiring layer 2004 through the opening 2025.

In the FIGS. 6B to 8D above, the shapes, for example the sectional views of the via hole 1011 and the opening 2011 are inverted H shapes. As viewed from the top view, an external diameter of a side in contact with the first main body wiring layer 1002 and the first bridge wiring layer 2002 is larger than an external diameter of a layer located in the first substrate 1001 and the second substrate 2001, and an external diameter of a side in contact with the second main body wiring layer 1004 and the second bridge wiring layer 2004 is larger than an external diameter of a layer located in the first substrate 1001 and the second substrate 2001.

The via hole 1011 and the opening 2011 make the upper and lower layers (the first main body wiring layer 1002 and the second main body wiring layer 1004, the first bridge wiring layer 2002 and the second bridge wiring layer 2004) electrically connected.

For example, when the second bridge wiring layer 2004 is a ground layer, the ground layer 2004 and the shielding layer 2006 can function as a double shielding to prevent signal crosstalk between wirings on the main body sub-circuit board 100 and wirings on the bridge sub-circuit board 200. For example, the shielding layer 2006 has a hollowed-out structure 2016 formed at a position corresponding to the opening 2015 of the second bridge insulating layer 2005 to expose a bridge end.

For example, the shielding layer 2006 includes an insulating substrate and a conductive material filled in the insulating substrate. For example, the insulating substrate is made of epoxy resin, and the filled conductive material is copper powder, graphite powder, or the like. Alternatively, in some embodiments, the shielding layer 2006 may also be made of a metal material, which is not specifically limited by the embodiments of the present disclosure. For example, the shielding layer may be directly attached to the second side of the bridge sub-circuit board 200 after being formed.

S103: installing the bridge sub-circuit board on the main body sub-circuit board.

With reference to FIG. 1A, the third bridge connection end 201 and the fourth bridge connection end 202 of the bridge sub-circuit board 200 are respectively electrically connected to the first bridge connection end 101 and the second bridge connection end 102 of the main body sub-circuit board 100, so that the bridge sub-circuit board 200 is installed on the main body sub-circuit board 100, and the first wiring portion 103, the third wiring portion 203 and the second wiring portion 104 are sequentially electrically connected to obtain the first functional wiring. When being installed, the second side of bridge sub-circuit board 200 is closer to the main body sub-circuit board 100 than the first side thereof, so that wirings on the main body sub-circuit board 100 and the bridge sub-circuit board 200 may be shielded by the ground layer 2004 and the shielding layer 2006, to prevent signal crosstalk.

For example, the third bridge connection end 201 and the fourth bridge connection end 202 of the bridge sub-circuit board 200 may be respectively connected to the first bridge connection end 101 and the second bridge connection end 102 of the main body sub-circuit board 100 by hot pressing, welding or connectors. For example, in the manner of hot pressing, an anisotropic conductive adhesive is formed between two bridge ends, and then the bridge ends are hot pressure-molded to connect these two bridge ends together by the anisotropic conductive adhesive. For example, the connector includes a zero insertion force (ZIF) connector or a board to board (BTB) connector, and the embodiments of the present disclosure do not specifically limit the connection mode.

In an example, for example, a BTB connector is used to connect the main body sub-circuit board 100 and the bridge sub-circuit board 200. At this time, the connector includes a male connector and a female connector cooperated with each other. For example, the first bridge connection end 101 and the second bridge connection end 102 of the main body sub-circuit board 100 are provided with female connectors, the third bridge connection end 201 and the fourth bridge connection end 202 of the bridge sub-circuit board 200 are provided with male connectors, so that the bridge sub-circuit board 200 may be connected to the main body sub-circuit board 100 through plug-in of the male connector and the female connector.

The manufacturing method of the flexible circuit board provided by the embodiment of the present disclosure provides a main body sub-circuit board and a bridge sub-circuit board, and wirings at both sides of the main body sub-circuit board are bridged by the bridge sub-circuit board. This method can avoid the wirings from intersecting on the main body sub-circuit board, prevent or weaken signal crosstalk, or avoid adding additional functional layers to prevent the signal crosstalk, and thus avoid complexity of the circuit board structure. In addition, the main body sub-circuit board and the bridge sub-circuit board provided by the manufacturing method have a simple single-layer structure or a double-layer structure, so as to make the wiring layout simpler, and reduce the manufacturing difficulty of the main body sub-circuit board and the bridge sub-circuit board.

Following points need to be explained:

(1) the drawings of the embodiments of this disclosure only refer to structures related to the embodiments of this disclosure, other structures may refer to the general designs;

(2) for the sake of clarity, in the drawings for describing the embodiments of the present disclosure, the thickness of a layer or an area is increased or decreased, that is, these drawings are not drawn to the actual scale. It can be understood that when an element such as a layer, a film, an area or a substrate is referred to as being formed "above" or "below" another element, the element may be "directly" formed "above" or "below" another element, or formed with intervening elements therebetween;

(3) the embodiments and the features in the embodiments of the present disclosure may be combined with each other with any conflict to obtain new embodiments.

Figure 13:
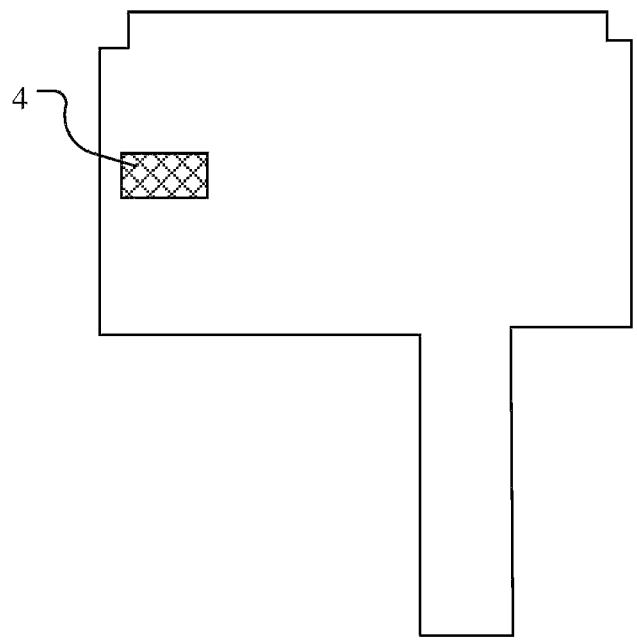
FIG. 13 is a schematic structural view of a main circuit board in an exemplary embodiment of the circuit board structure of the present disclosure.
Figure 14:
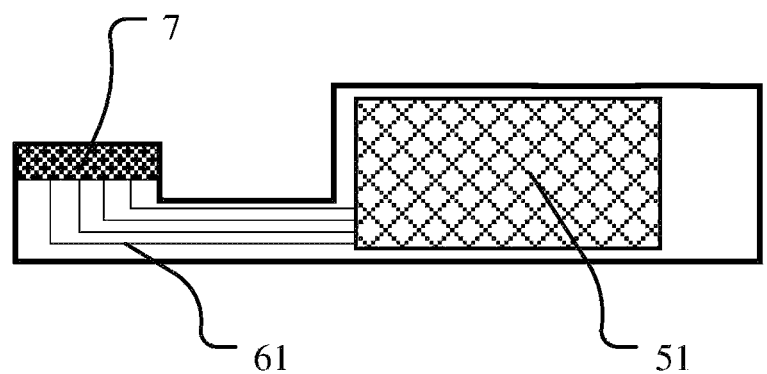
FIG. 14 is a schematic structural view of a transfer circuit board in an exemplary embodiment of the circuit board structure of the present disclosure.
Figure 15:
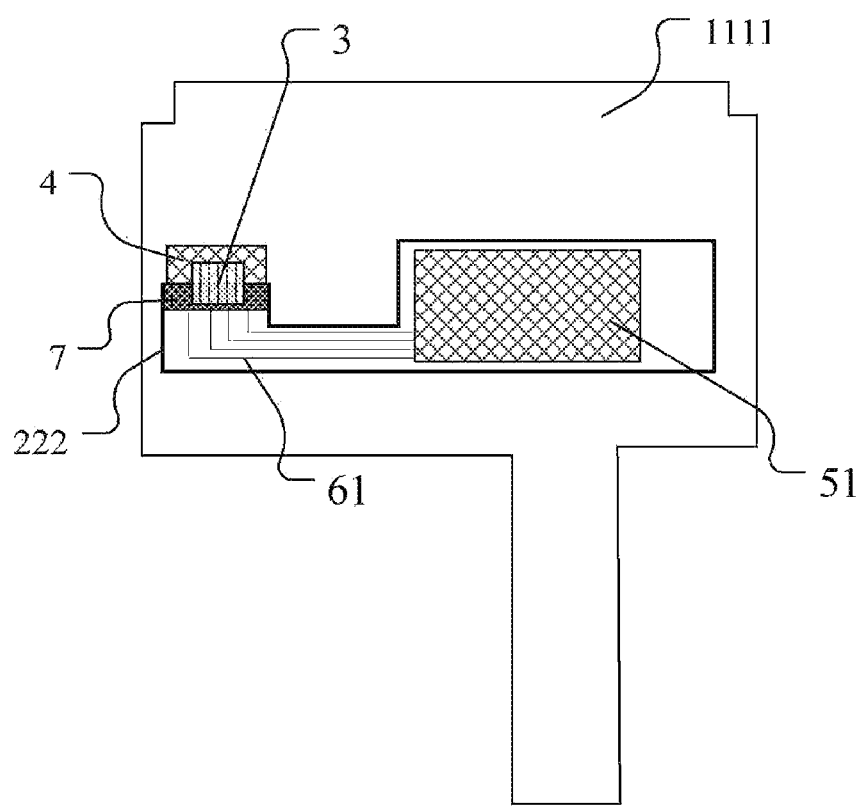
FIG. 15 is a schematic structural view of an exemplary embodiment of the circuit board structure of the present disclosure.

The exemplary embodiment also provides a circuit board structure, and FIG. 13 is a schematic structural view of a main circuit board in an exemplary embodiment of the circuit board structure of the present disclosure. FIG. 14 is a schematic structural view of a transfer circuit board in an exemplary embodiment of the circuit board structure of the present disclosure, and FIG. 15 is a schematic structural view of an exemplary embodiment of the circuit board structure of the present disclosure. As shown in FIGS. 13, 14 and 15, the circuit board structure includes a main circuit board 1111, a transfer circuit board 222 and a connector 3. The main circuit board has a double circuit layer structure and carries a main board lapping end 4; the transfer circuit board 222 has a double circuit layer structure laminated on the main circuit board 1111 and carries a first element lapping end 51 for lapping a first element set, a first leading wire set 61 connected to the first element lapping end 51, and a transfer board lapping end 7 connected to the first leading wire set 61; the connector 3 is disposed between the main circuit board 1111 and the transfer circuit board 222, for connecting the main board lapping end 4 and the transfer board lapping end 7.

In the circuit board structure provided by the present disclosure, a circuit layer may be provided on each of the main circuit board and the transfer circuit board, and the circuit layers may include circuit leading wires and device lapping ends. On the one hand, the circuit board structure provided by the present disclosure can realize the lamination arrangement of circuit layers by laminating the main circuit board layer and the transfer circuit board, to reduce the occupied space of the circuit board structure; on the other hand, the double circuit layer circuit board has a mature manufacturing process and simple structural design, to reduce the design cost of the circuit board.

In this exemplary embodiment, the number of the transfer circuit board is one, however, it should be understood that the number of the transfer circuit board may be plural in other exemplary embodiments.

In this exemplary embodiment, any one of the transfer board lapping end 7 and the main board lapping end 4 may be a pin set. When the transfer circuit board and the main circuit board are laminated, the main board lapping end 4 may be disposed at a side of the main circuit board facing the transfer circuit board; the transfer board lapping end 7 may be disposed at a side of the transfer circuit board facing away from the main circuit board, or at a side of the transfer circuit board facing the main circuit board. The connector may be a plug-in connector, a snapping connector, a soldering connector, or the like. For example, the connector may be a snapping connector, and the transfer board lapping end 7 may be disposed at a side of the transfer circuit board facing the main circuit board. The snapping connector may include a first connecting portion and a second connecting portion, the first connecting portion may be fixed to a side of the transfer circuit board facing the main circuit board to connect the transfer board lapping end 7, and the second connecting portion may be fixed on the main circuit board to connect the main board lapping end 4. The electrical connection between that transfer board lapping end 7 and the main board lapping end 4 can be realize by snapping the first connecting portion and the second connecting portion. In another example, the connector may be a soldering connector, and the transfer board lapping end 7 may be disposed at a side of the transfer circuit board facing away from the main circuit board. In this connection mode, corresponding pins in the transfer board lapping end 7 and the main board lapping end 4 may be soldered by a solder paste.

Figure 16:
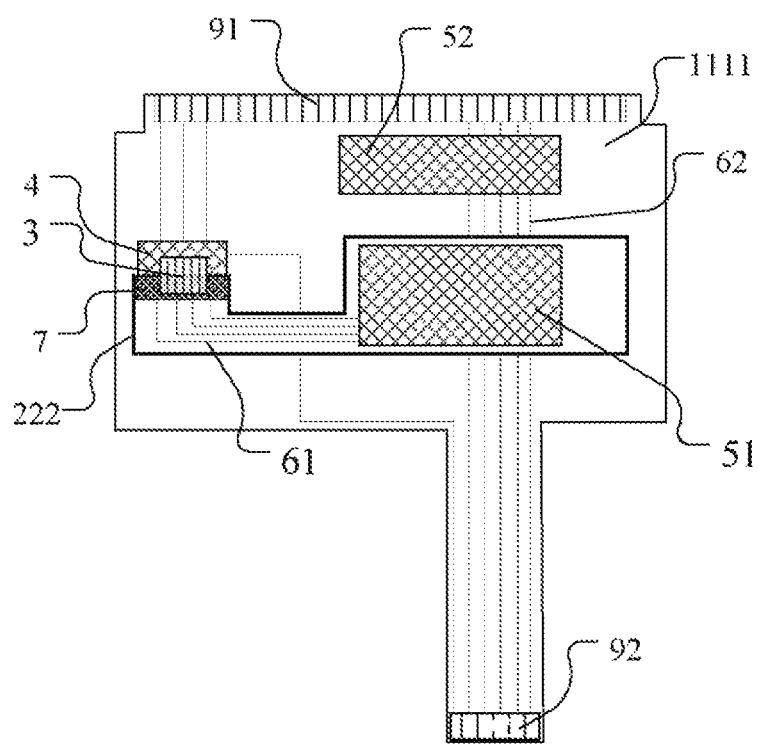
FIG. 16 is a schematic structural view of another exemplary embodiment of the circuit board structure of the present disclosure.

In this exemplary embodiment, FIG. 16 is a structural schematic view of another exemplary embodiment of the circuit board structure of the present disclosure. As shown in FIG. 16, a second leading wire set 62 may be arranged on the main circuit board, and an orthographic projection of the transfer circuit board 222 on the main circuit board 1111 covers at least a part of the second leading wire set 62. The first leading wire set 61 and the second leading wire set 62 are laminated so as to reduce the occupied space of the circuit board structure.

In this exemplary embodiment, as shown in FIG. 16, the main circuit board may also carry a second element lapping end 52 for lapping the second group of elements, and the second element lapping end 52 may be connected to the second leading wire set 62. The second element lapping end 52 may be located at a position other than the orthographic projection of the transfer circuit board on the main circuit board.

In this exemplary embodiment, a connector may be selected from a ZIF connector or a BTB connector, which has a small impedance and a stable performance, a lapping resistance value may be less than 10Ω, and the impedances of lapping channels have good consistence. Compared with the circuit board structure with a six-layer board, the circuit board structure provided by this embodiment has few difference in power consumption test data.

In this exemplary embodiment, as shown in FIG. 16, the main circuit board also carries a first group of external pins 91; a part of the first group of external pins 91 is connected with the main board lapping end 4 to connect a part of the first leading wire set 61, and a part of the first group of external pins 91 is connected to the second leading wire set 62. In this exemplary embodiment, as shown in FIG. 16, the main circuit board also carries a second group of external pins 92; a part of the second group of external pins 92 is connected to the second leading wire set 62, and a part of the second group of external pins 92 is connected with the main board lapping end 4 to connect a part of the first leading wire set.

In this exemplary embodiment, the first group of external pins 91 and the second group of external pins 92 may be externally connected to a signal terminal. For example, the circuit board structure may be applied to a display panel, the first group of external pins 91 may be connected to the signal terminal of the display panel, and the second group of external pins 92 may be connected to an external chip. The first leading wire set 61 may be used to transmit a touch-related signal, the second leading wire set 62 may be used to transmit a display-related signal, the first element lapping end 51 may be used to lap a touch-related chip, and the second element lapping end 52 may be used to lap a display-related chip. For transmission of the touch-related signal, the display panel outputs a touch-related signal which is transmitted to the first element lapping end 51 through a part of the first group of external pins 91, the main board lapping end, the connector, the transfer board lapping end and a part of the first leading wire set 61; the touch-related chip connected to the first element lapping end 51 receives the touch-related signal and outputs another touch-related signal which is output to the second group of external pins 92 through a part of the first leading wire set 61, the transfer board lapping end, the connector and the main board lapping end. For the transmission of the display related signal, the display related signal is transmitted to the second element lapping end 52 through a part of the first group of external pins 91 and the second leading wire set 62, the display related chip connected to the second element lapping end 52 receives the display related signal and outputs another display related signal which is output to the second group of external pins 92.

It should be understood that the first leading wire set 61 may also be used to transmit other related signals, such as a fingerprint unlocking related signal and a brightness sensing related signal. The circuit board structure may also be applied to other technical fields other than display panels, which all are within the protection scope of this disclosure.

Figure 17:
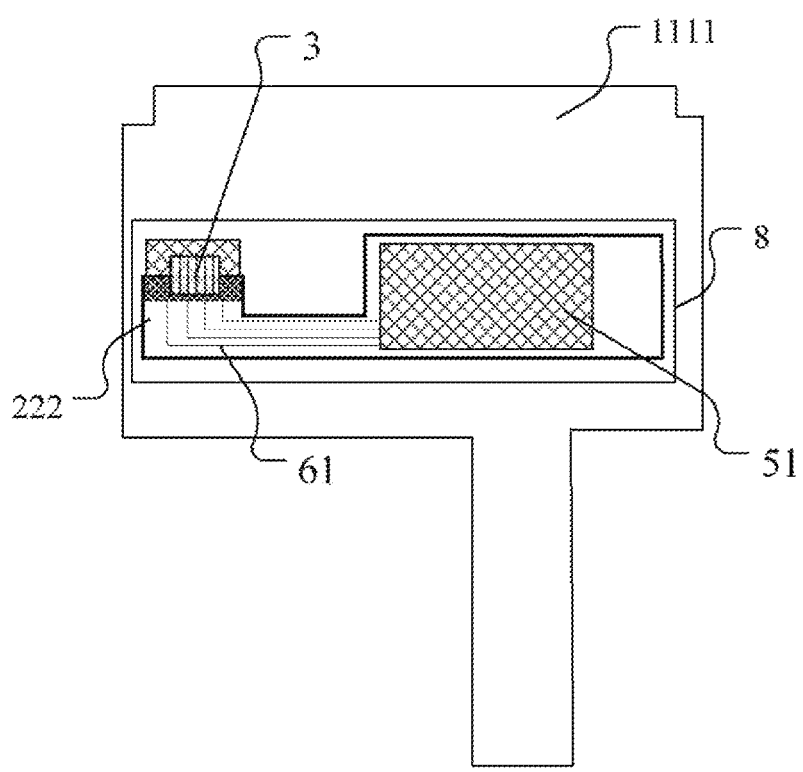
FIG. 17 is a schematic structural view of an exemplary embodiment of the circuit board structure of the present disclosure.

In this exemplary embodiment, FIG. 17 is a structural schematic view of an exemplary embodiment of the circuit board structure of the present disclosure. As shown in FIG. 17, the circuit board structure may further include a shielding layer 8 laminated between the main circuit board 1111 and the transfer circuit board 222. The orthographic projection of the transfer circuit board 222 may be located on the shielding layer 8 which may be used to shield signals of circuits on the main circuit board and the transfer circuit board. The shielding layer may be an EMI shielding layer.

Figure 18:
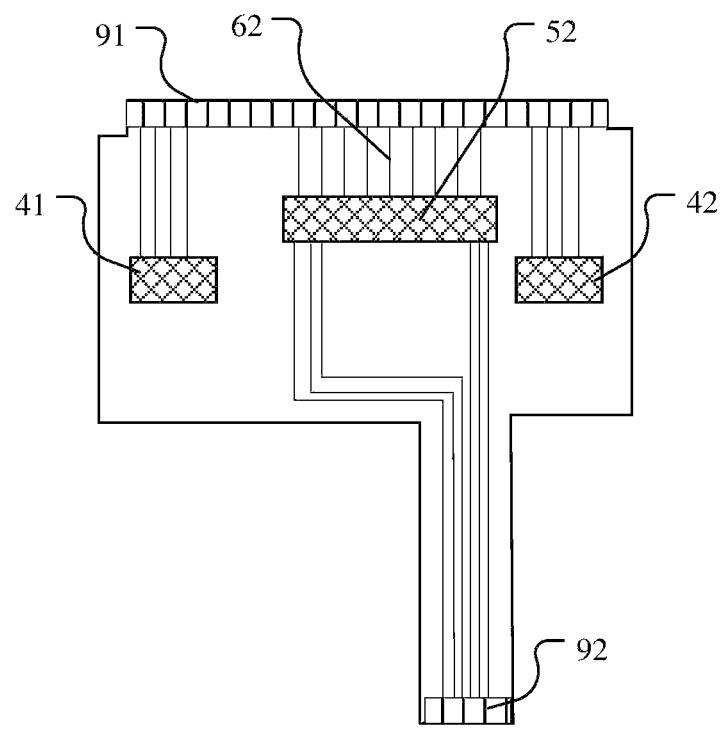
FIG. 18 is a schematic structural view of a main circuit board in an exemplary embodiment of the circuit board structure of the present disclosure.
Figure 19:
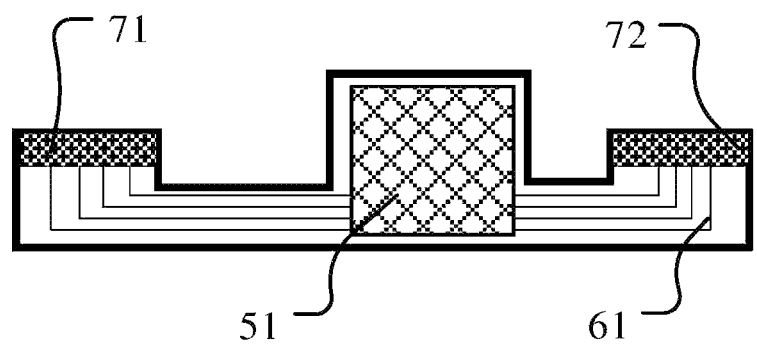
FIG. 19 is a schematic structural view of a transfer circuit board in an exemplary embodiment of the circuit board structure of the present disclosure.
Figure 20:
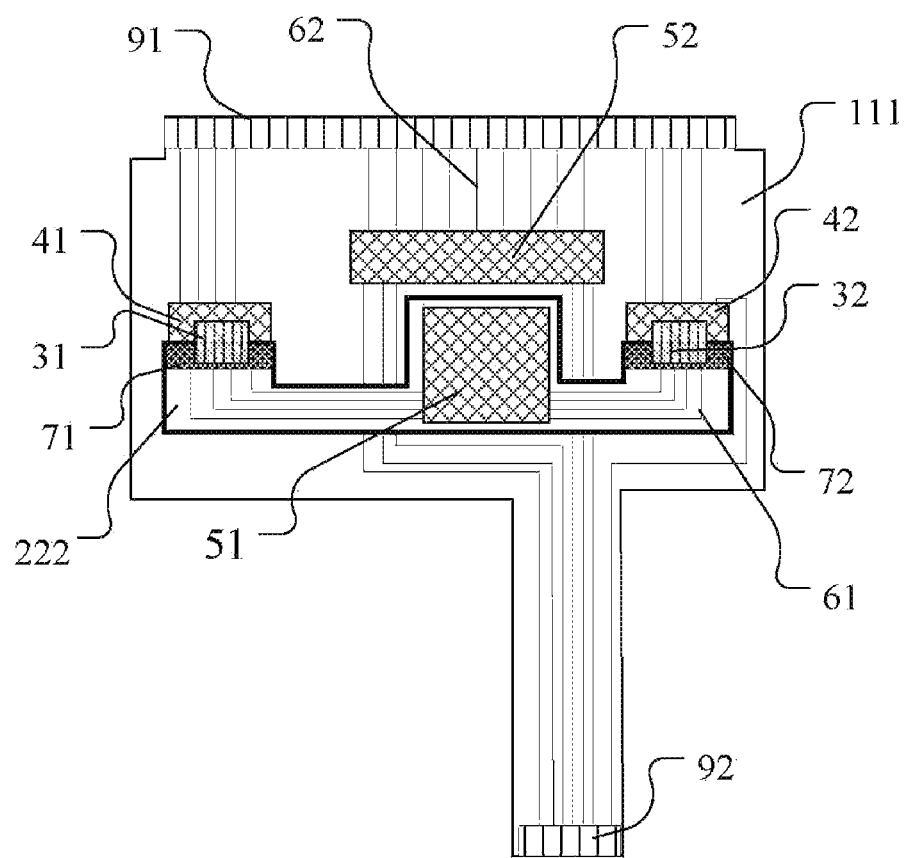
FIG. 20 is a schematic structural view of an exemplary embodiment of the circuit board structure of the present disclosure.

In this exemplary embodiment, the main board lapping end includes a plurality of main sub-board lapping ends, the transfer board lapping end includes a plurality of transfer sub-board lapping ends, and the connector may be in plural. The main sub-board lapping ends and the transfer sub-board lapping ends are connected in one-to-one correspondence through the connectors. The number of main sub-board lapping ends may be provided according to the actual situation. For example, FIG. 18 is a schematic structural view of the main circuit board in an exemplary embodiment of the circuit board structure, FIG. 19 is a schematic structural view of the transfer circuit board in an exemplary embodiment of the circuit board structure, and FIG. 20 is a schematic structural view of an exemplary embodiment of the circuit board structure. As shown in FIGS. 18, 19 and 20, the main board lapping end 4 may include two main sub-board lapping ends 41 and 42, and the two main sub-board lapping ends 41 and 42 may be respectively disposed at opposite sides of the second leading wire set 62. Accordingly, the transfer board lapping end 7 may include two transfer sub-board lapping ends 71 and 72. The main sub-board lapping end 41 is connected to the transfer sub-board lapping end 71 through the connector 31, and the main sub-board lapping end 42 is connected to the transfer sub-board lapping end 72 through the connector 32.

In this exemplary embodiment, at least one of the main circuit board and the transfer circuit board may be a flexible circuit board. It should be understood that, in other exemplary embodiments, the main circuit board or the transfer circuit board may also be a non-flexible circuit board, which all are within the protection scope of this disclosure.

In this exemplary embodiment, the main circuit board may include a first substrate and circuit layers located at both sides or a circuit layer at a side of the first substrate, wherein the circuit layers at both sides of the first substrate may be electrically connected through a via hole on the substrate; the transfer circuit board may include a second substrate and circuit layers at both sides or a circuit layer at a side of the second substrate, wherein the circuit layers at both sides of the second substrate may be electrically connected through a via hole on the substrate.

The exemplary embodiment also provides a display panel including the circuit board structure described above. The display panel may be applied to a display device such as a television, a mobile phone and a tablet computer.

The present disclosure may include dedicated hardware implementations such as application specific integrated circuits, programmable logic arrays and other hardware devices. The hardware implementations can be constructed to implement one or more of the methods described herein. Examples that may include the apparatus and systems of various implementations can broadly include a variety of electronic and computing systems. One or more examples described herein may implement functions using two or more specific interconnected hardware modules or devices with related control and data signals that can be communicated between and through the modules, or as portions of an application-specific integrated circuit. Accordingly, the system disclosed may encompass software, firmware, and hardware implementations. The terms "module," "sub-module," "circuit," "sub-circuit," "circuitry," "sub-circuitry," "unit," or "sub-unit" may include memory (shared, dedicated, or group) that stores code or instructions that can be executed by one or more processors. The module refers herein may include one or more circuit with or without stored code or instructions. The module or circuit may include one or more components that are connected.

The present disclosure is described merely through aforesaid specific implementations, but the protection scope of the present disclosure is not limited thereto. Any person skilled in the art may easily think of variations or substitutions within the technical scope as disclosed in the present disclosure, which all should be contained within the scope of the disclosure.

What is claimed is:

1. A flexible circuit board comprising:
   a main body sub-circuit board comprising a first substrate, and a first bridge connection end, a second bridge connection end, a first wiring portion and a second wiring portion on the first substrate, in which the first wiring portion and the second wiring portion are separated from each other and electrically connected to the first bridge connection end and the second bridge connection end, respectively;

a bridge sub-circuit board comprising a second substrate, and a third bridge connection end, a fourth bridge connection end and a third wiring portion for a first functional wiring on the second substrate, in which the third bridge connection end and the fourth bridge connection end are electrically connected by the third wiring portion, and a first control circuit combination structure, in which the first control circuit combination structure is disposed on the main body sub-circuit board and electrically connected to the first wiring portion, or the first control circuit combination structure is disposed on the bridge sub-circuit board and electrically connected to the third wiring portion, the first control circuit combination structure being configured to provide a first electrical signal to the first functional wiring or receive a first electrical signal from the first functional wiring, the bridge sub-circuit board being configured to be installed on the main body sub-circuit board by electrically connecting the third bridge connection end and the fourth bridge connection end to the first bridge connection end and the second bridge connection end, respectively, so that the first wiring portion, the third wiring portion and the second wiring portion are sequentially electrically connected to obtain the first functional wiring;

an outline shape of the first substrate being different from that of the second substrate; and the main body sub-circuit board further comprising a second functional wiring, the second functional wiring being electrically connected to the first control circuit combination structure on the main body sub-circuit board, the first control circuit combination structure being further configured to provide a second electrical signal to the second functional wiring or receive a second electrical signal from the second functional wiring.

2. The flexible circuit board of claim 1, wherein the first functional wiring is obtained by sequentially electrically connecting the first wiring portion, the third wiring portion and the second wiring portion, and one of the first functional wiring and the second functional wiring is used to transmit a touch driving signal, and the other of the first functional wiring and the second functional wiring is used to transmit a touch sensing signal.

3. The flexible circuit board of claim 1, wherein the main body sub-circuit board further comprises a third functional wiring;

the third functional wiring is between the first wiring portion and the second wiring portion;

the bridge sub-circuit board is connected to the third functional wiring;

the first wiring portion and the second wiring portion pass under the bridge sub-circuit board for connection.

4. The flexible circuit board of claim 1, wherein the main body sub-circuit board further comprises a third functional wiring;

the third functional wiring is between the first wiring portion and the second wiring portion, and an orthographic projection of the third functional wiring on the first substrate at least partially overlaps with an orthographic projection of the bridge sub-circuit board on the first substrate.

5. The flexible circuit board of claim 1, wherein the main body sub-circuit board comprises a first main body wiring layer at a first side of the first substrate, and a first main body insulating layer laminated on a side of the first main body wiring layer far away from the first substrate;

the first side is a side of the main body sub-circuit board close to the bridge sub-circuit board;

the main body sub-circuit board further comprises a second main body wiring layer at a second side of the first substrate, and a second main body insulating layer laminated on a side of the second main body wiring layer far away from the first substrate;

a part of the first wiring portion is in the first main body wiring layer, and another part of the first wiring portion is in the second main body wiring layer;

a part of the second wiring portion is in the first main body wiring layer, and another part of the second wiring portion is in the second main body wiring layer.

6. The flexible circuit board of claim 5, wherein the first main body insulating layer has a first via hole that exposes the first bridge connection end and the second bridge connection end.

7. The flexible circuit board of claim 6, wherein at least a part of a wiring of the first wiring portion on the second main body wiring layer is electrically connected to the first main body wiring layer through a second via hole, for electrically connecting to the bridge sub-circuit board through the first bridge connection end; and at least a part of a wiring of the second wiring portion on the second main body wiring layer is electrically connected to the first main body wiring layer through the second via hole, for electrically connecting to the bridge sub-circuit board through the second bridge connection end.

8. The flexible circuit board of claim 1, wherein the main body sub-circuit board comprises a first main body wiring layer at a first side of the first substrate, and a first main body insulating layer laminated on a side of the first main body wiring layer far away from the first substrate;

the main body sub-circuit board further comprises a second main body wiring layer at a second side of the first substrate opposite to the first side thereof, and a second main body insulating layer laminated on a side of the second main body wiring layer far away from the first substrate;

the first main body wiring layer comprises the first wiring portion, the second wiring portion and the first bridge connection end, the first bridge connection end is exposed by the first main body insulating layer; the second main body wiring layer comprises the first wiring portion, the second wiring portion and the second bridge connection end, the second bridge connection end is exposed by the second main body insulating layer.

9. The flexible circuit board of claim 1, wherein the bridge sub-circuit board comprises a first bridge wiring layer at a first side of the second substrate, and a first bridge insulating layer laminated on a side of the first bridge wiring layer far away from the second substrate;

the first bridge wiring layer comprises the third wiring portion.

10. The flexible circuit board of claim 9, wherein the bridge sub-circuit board further comprises a ground layer at a second side of the second substrate opposite to the first side thereof;

when the bridge sub-circuit board is installed on the main body sub-circuit board, the second side is closer to the main body sub-circuit board than the first side.

11. The flexible circuit board of claim 10, wherein the bridge sub-circuit board further comprises a second bridge insulating layer laminated at a side of the ground layer far away from the second substrate, the second bridge insulating layer is provided with a plurality of openings exposing a part of the ground layer, and the plurality of openings serve as the third bridge connection end and/or the fourth bridge connection end, for electrically connecting the bridge sub-circuit board to the main body sub-circuit board.

12. The flexible circuit board of claim 10, wherein the bridge sub-circuit board further comprises a shielding layer at the second side of the second substrate, and the shielding layer is laminated on a side of the ground layer far away from the second substrate.

13. The flexible circuit board of claim 9, wherein the bridge sub-circuit board further comprises a second bridge wiring layer at a second side of the second substrate opposite to the first side thereof, and a second bridge insulating layer laminated on a side of the second bridge wiring layer far away from the second substrate;
the second bridge wiring layer comprises the third wiring portion, the third bridge connection end and the fourth bridge connection end, in which the third bridge connection end and the fourth bridge connection end are exposed by the second bridge insulating layer;
when the bridge sub-circuit board is installed on the main body sub-circuit board, the second side is closer to the main body sub-circuit board than the first side.

14. The flexible circuit board of claim 9, wherein the bridge sub-circuit board further comprises a second bridge wiring layer at a second side of the second substrate opposite to the first side thereof, and a second bridge insulating layer laminated on a side of the second bridge wiring layer far away from the second substrate;
the first bridge wiring layer further comprises the third bridge connection end exposed by the first bridge insulating layer;
the second bridge wiring layer comprises the third wiring portion and the fourth bridge connection end, in which the fourth bridge connection end is exposed by the second bridge insulating layer.

15. The flexible circuit board of claim 1, wherein the main body sub-circuit board comprises a plurality of first bridge connection ends and a plurality of second bridge connection ends; the bridge sub-circuit board is in plural; and a plurality of the bridge sub-circuit boards are installed on the main body sub-circuit board by respectively electrically connecting a plurality of the third bridge connection ends and a plurality of the fourth bridge connection ends to a plurality of the first bridge connection ends and a plurality of the second bridge connection ends.

16. The flexible circuit board of claim 5, wherein the main body sub-circuit board further comprises a terminal with a plurality of first contact pads thereon;
an end of each of a plurality of wirings of the second wiring portion is electrically connected to each of some of the first contact pads in the terminal in one-to-one correspondence;
an end of each of a plurality of wirings of the second functional wiring is electrically connected to each of some other of the first contact pads in the terminal in one-to-one correspondence;
an end of each of a plurality of wirings of the third functional wiring is electrically connected to each of some further of the first contact pads in the terminal in one-to-one correspondence;
some of the first contact pads respectively electrically connected to the second wiring portion, the third functional wiring and the second functional wiring are spaced apart in the terminal.

17. The flexible circuit board of claim 5, wherein the main body sub-circuit board further comprises a terminal with a plurality of first contact pads;
an end of each of a plurality of wirings of the second wiring portion is electrically connected to each of some of the first contact pads in the terminal in one-to-one correspondence;
an end of each of a plurality of wirings of the second functional wiring is electrically connected to each of some other of the first contact pads in the terminal in one-to-one correspondence;
an end of each of a plurality of wirings of the third functional wiring is electrically connected to each of some further of the first contact pads in the terminal in one-to-one correspondence;
some of the first contact pads electrically connected to the second wiring portion, the third functional wiring and the second functional wiring are continuously arranged in the terminal.

18. A flexible circuit board comprising:
a main body sub-circuit board comprising a first substrate, and a first bridge connection end, a second bridge connection end, a first wiring portion and a second wiring portion on the first substrate, in which the first wiring portion and the second wiring portion are separated from each other and electrically connected to the first bridge connection end and the second bridge connection end, respectively;
a bridge sub-circuit board comprising a second substrate, and a third bridge connection end, a fourth bridge connection end and a third wiring portion for a first functional wiring on the second substrate, in which the third bridge connection end and the fourth bridge connection end are electrically connected by the third wiring portion; wherein
the bridge sub-circuit board is configured to be installed on the main body sub-circuit board by respectively electrically connecting the third bridge connection end and the fourth bridge connection end to the first bridge connection end and the second bridge connection end, so that the first wiring portion, the third wiring portion and the second wiring portion are sequentially electrically connected to obtain the first functional wiring;
an outline shape of the first substrate is different from that of the second substrate;
the main body sub-circuit board comprises a first main body wiring layer at a first side of the first substrate and a first main body insulating layer laminated on a side of the first main body wiring layer far away from the first substrate, and the first side is a side of the main body sub-circuit board close to the bridge sub-circuit board; the main body sub-circuit board further comprises a second main body wiring layer at a second side of the first substrate and a second main body insulating layer laminated on a side of the second main body wiring layer far away from the first substrate; a part of the first wiring portion is in the first main body wiring layer, and another part of the first wiring portion is in the second main body wiring layer; a part of the second wiring portion is in the first main body wiring layer, and another part of the second wiring portion is in the second main body wiring layer; a second functional wiring is all in the first main body wiring layer, and a third functional wiring is all in the second main body wiring layer; the first main body insulating layer has a first via hole exposing the first bridge connection end and the second bridge connection end; at least some of wirings of the first wiring portion in the second main body wiring layer are electrically connected to the first main body wiring layer through a second via hole, for electrically connecting to the bridge sub-circuit board through the first bridge connection end; and at least some of wirings of the second wiring portion in the second main body wiring layer are electrically connected to the first main body wiring layer through the second via hole, for electrically connecting to the bridge sub-circuit board through the second bridge connection end;

the bridge sub-circuit board comprises a first bridge wiring layer at a first side of the second substrate and a first bridge insulating layer laminated on a side of the first bridge wiring layer far away from the second substrate, in which the first bridge wiring layer comprises the third wiring portion; the bridge sub-circuit board further comprises a ground layer at a second side of the second substrate opposite to the first side thereof, and when the bridge sub-circuit board is installed on the main body sub-circuit board, the second side is closer to the main body sub-circuit board than the first side; the bridge sub-circuit board further comprises a second bridge insulating layer laminated on a side of the ground layer far away from the second substrate, and the second bridge insulating layer is provided with a plurality of openings exposing a part of the ground layer, and the plurality of openings serve as the third bridge connection end and/or the fourth bridge connection end, for electrically connecting the bridge sub-circuit board to the main body sub-circuit board.

\* \* \* \* \*